(12) United States Patent
Poon et al.

(10) Patent No.: US 11,003,203 B2
(45) Date of Patent: May 11, 2021

(54) CIRCUITS FOR AND METHODS OF CALIBRATING A CIRCUIT IN AN INTEGRATED CIRCUIT DEVICE

(71) Applicant: Xilinx, Inc., San Jose, CA (US)

(72) Inventors: Chi Fung Poon, Sunnyvale, CA (US); Asma Laraba, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 78 days.

(21) Appl. No.: 16/518,365

(22) Filed: Jul. 22, 2019

(65) Prior Publication Data
US 2020/0293080 A1    Sep. 17, 2020

Related U.S. Application Data

(63) Continuation-in-part of application No. 16/042,785, filed on Jul. 23, 2018, now Pat. No. 10,712,770.

(51) Int. Cl.
*H04L 7/00* (2006.01)
*G06F 1/04* (2006.01)
(Continued)

(52) U.S. Cl.
CPC .............. *G06F 1/04* (2013.01); *H03K 5/1565* (2013.01); *G06F 1/10* (2013.01)

(58) Field of Classification Search
CPC .......... G06F 1/10; G06F 1/12; G06F 13/1689; H03K 19/1837; H04J 3/0685
(Continued)

(56) References Cited

U.S. PATENT DOCUMENTS 6,600,355 B1 * 7/2003 Nguyen .................... G06F 1/08
327/149
7,346,794 B1  3/2008 Davidson et al.
(Continued)

OTHER PUBLICATIONS

Melikyan, Vazgen et al., Serializer/Deserializer Output Data Signal Duty Cycle Correction Method, 4 pages, published Jun. 2013.
(Continued)

*Primary Examiner* — Volvick Derose
(74) *Attorney, Agent, or Firm* — Patterson + Sheridan, LLP

(57) ABSTRACT

A circuit arrangement for calibrating a circuit in an integrated circuit device is described. The circuit arrangement may comprise a main circuit configured to receive input data at a first input and generate output data at a first output, wherein the output data is based upon the input data and a function of the main circuit; a replica circuit configured to receive calibration data at a second input and generate calibration output data, based upon the calibration data, at a second output, wherein the replica circuit provides a replica function of the function of the main circuit; and a calibration circuit configured to receive the output data from the main circuit during a foreground calibration mode, and the calibration output data from the replica circuit during a background calibration mode; wherein the calibration circuit provides control signals to the main circuit during the background calibration mode. A method of calibrating a circuit in an integrated circuit device is also described.

20 Claims, 19 Drawing Sheets

(51) Int. Cl.
*H03K 5/156* (2006.01)
*G06F 1/10* (2006.01)

(58) Field of Classification Search
USPC .......................................................... 713/40
See application file for complete search history.

(56) References Cited

U.S. PATENT DOCUMENTS

| | | | |
|---|---|---|---|
| 7,426,247 B2 | 3/2008 | Yang et al. | |
| 7,478,030 B1* | 1/2009 | Ballagh | G06F 30/331 703/19 |
| 8,564,330 B1 | 10/2013 | Radulov et al. | |
| 8,594,264 B1 | 11/2013 | Zhu et al. | |
| 8,650,429 B1* | 2/2014 | Starr | H03K 19/01837 713/400 |
| 8,841,948 B1 | 9/2014 | Chien et al. | |
| 9,148,192 B1* | 9/2015 | Wong | H04L 25/14 |
| 9,237,047 B1 | 1/2016 | Zhang et al. | |
| 9,331,701 B1 | 5/2016 | Zhang et al. | |
| 9,355,696 B1 | 5/2016 | Magee et al. | |
| 9,385,769 B2 | 7/2016 | Elzeftawi | |
| 9,450,569 B1 | 9/2016 | Ansari | |
| 9,602,082 B2 | 3/2017 | Hedayati et al. | |
| 9,825,643 B1* | 11/2017 | Taylor | H03M 1/0678 |
| 9,876,489 B1 | 1/2018 | Casey et al. | |
| 10,103,718 B1 | 10/2018 | Swanson et al. | |
| 2002/0196061 A1* | 12/2002 | Atyunin | H03L 7/07 327/158 |
| 2004/0221144 A1* | 11/2004 | Chiao | G06F 1/10 713/1 |
| 2008/0036509 A1* | 2/2008 | Jang | H03K 5/1565 327/141 |
| 2011/0181451 A1* | 7/2011 | Tsunoda | H03M 9/00 341/101 |
| 2012/0001781 A1* | 1/2012 | Scanlan | H03M 1/1004 341/110 |
| 2012/0249348 A1* | 10/2012 | Siragusa | H03M 1/1033 341/110 |
| 2014/0198810 A1* | 7/2014 | Jones | G06F 1/10 370/507 |
| 2014/0320229 A1* | 10/2014 | Ali | H04L 25/0298 333/17.3 |
| 2014/0325253 A1* | 10/2014 | Ogata | H03K 5/133 713/601 |
| 2015/0381337 A1* | 12/2015 | Madoglio | G04F 10/005 375/357 |
| 2016/0248574 A1* | 8/2016 | Zhou | H04B 1/525 |
| 2019/0007036 A1* | 1/2019 | Fu | H03K 5/00006 |
| 2019/0080734 A1* | 3/2019 | Tsuji | H03L 7/08 |

OTHER PUBLICATIONS

Texas Instruments, KeyStone II Architecture Serializer/Deserializer User Guide, 155 pages, published 2016.

Tan, KeeHian et al., A 112-Gb/s PAM4 Transmitter in 16nm FinFET, published 2018.

Intel, LVDS SERDES Transmitter/ Receiver IP Cores User Guide, published 2017.

Xilinx, Inc., Application Note: Spartan-6 FPGAs, XAPP1064, Source-Synchronous Serialization and Deserialization (up to 1050 Mb/s), v1.2, Nov. 19, 2013, San Jose, CA USA.

Xilinx, Inc., Application Note: UltraScale and UltraScale+ FPGAs, XAAP1315, LVDS Source Synchronous 7:1 Serialization and Deserialization using Clock Multiplication, v1.0, Apr. 15, 2017, San Jose, CA USA.

Jaiswal, Nivedita et al., Design of a New Serializer and Deserializer Architecture for On-Chip SerDes Transceivers, published Mar. 27, 2015.

* cited by examiner

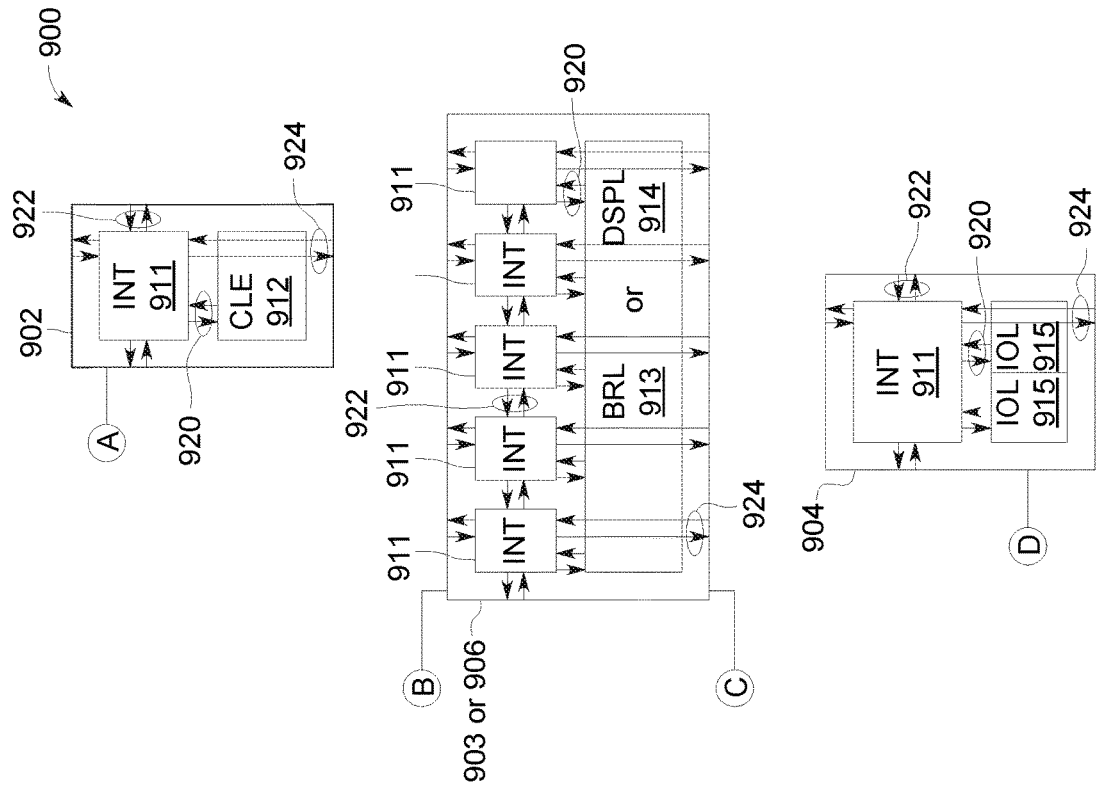

CIRCUITS FOR AND METHODS OF CALIBRATING A CIRCUIT IN AN INTEGRATED CIRCUIT DEVICE

TECHNICAL FIELD

Various embodiments relate generally to integrated circuits, and more particularly to circuits for and methods of calibrating a circuit in an integrated circuit device.

BACKGROUND

Modern networks are responsible for interconnecting computing devices operable to exchange data. Data may be exchanged from circuit board to circuit board along a common backplane, for example, in a computer or server. In some implementations, data may be exchanged over long distances, for example, from a travel agent's computer to an airline server on a cloud network. Modern networks may employ a number of mediums including physical wires, radio frequency (RF) channels or fiber optics. Data exchanged between computing devices may include data packets including multiple bits. In some network implementations, the bits may be transmitted and received simultaneously. Such communication may be known as parallel and may include multiple parallel connections known as a bus. In some implementations, data may be transmitted one bit at a time, or serially.

Given a common signal frequency, serial data communication is slower than parallel communication since with serial communication each bit is transmitted individually, and in parallel communication a group of bits are communicated simultaneously in sequential time slices. However, as communication signal frequencies increase (and time slices decrease), bit transit times may become a significant factor causing challenges for simultaneous data arrival times in parallel data implementations. Since serial transmission implementations transmit data one bit at a time, there is inherently no simultaneous data. This aspect of serial transmission may allow data to be transmitted at higher signaling frequencies. Accordingly, network designers may trade off various advantages and disadvantages of parallel versus serial data transmission for specific applications.

SUMMARY

A circuit arrangement for calibrating a circuit in an integrated circuit device is described. The circuit arrangement may comprise a main circuit configured to receive input data at a first input and generate output data at a first output, wherein the output data is based upon the input data and a function of the main circuit; a replica circuit configured to receive calibration data at a second input and generate calibration output data, based upon the calibration data, at a second output, wherein the replica circuit provides a replica function of the function of the main circuit; and a calibration circuit configured to receive the output data from the main circuit during a foreground calibration mode, and the calibration output data from the replica circuit during a background calibration mode; wherein the calibration circuit provides control signals to the main circuit during the background calibration mode.

A method for calibrating a circuit in an integrated circuit device is also described. The method may comprise configuring a main circuit to receive input data at a first input and generate output data at a first output, wherein the output data is based upon the input data and a function of the main circuit; configuring a replica circuit to receive calibration data at a second input and generate calibration output data, based upon the calibration data, at a second output, wherein the replica circuit provides a replica function of the function of the main circuit; and configuring a calibration circuit to receive the output data from the main circuit during a foreground calibration mode, and the calibration output data from the replica circuit during a background calibration mode; wherein the calibration circuit provides control signals to the main circuit and the replica circuit during the background calibration mode.

The details of various embodiments are set forth in the accompanying drawings and the description below. Other features and advantages will be apparent from the description and drawings, and from the claims.

BRIEF DESCRIPTION OF THE DRAWINGS

FIGS. 9A and 9B depict an exemplary programmable integrated circuit (IC) on which the disclosed circuits and processes may be implemented.

Like reference symbols in the various drawings indicate like elements.

DETAILED DESCRIPTION

To aid understanding, this document is organized as follows. First, an exemplary use case is briefly introduced with reference to FIG. 1. Second, with reference to FIG. 2 an exemplary multiplexer circuit of the type employed herein, is presented. Next with reference to FIG. 3, the multiplexer is replicated and employed in an exemplary phase adjustment module, the module generating a set of clocks (based on the in-phase and quadrature input clocks) adjusted for duty cycle and phase. Next with reference to FIG. 4, exemplary diagrams are presented to aid in the understanding of the replicated multiplexer (RMUX) described in FIG. 2. Next with reference to FIG. 5 the functionality of an exemplary sensing module is described. FIGS. 6A and 6B present the sequential and recursive clock adjustment functions in an exemplary duty cycle and phase adjustment module. Next, with reference to FIGS. 7 and 8, further explanatory discussion and experimental data is presented to explain improvements in clock jitter. Next, FIGS. 9A and 9B, an exemplary programmable integrated circuit (IC) on which the disclosed circuits and processes may be implemented, is described. Finally, with reference to FIG. 10, an exemplary clock phase alignment method is presented.

Throughout this application, the convention $CK_x$ may be used to define a clock signal, the subscript x indicating the relative phase delays in degrees. Further, $CK_{0,180}$ may be used as shorthand to define a pair of clock signals $CK_0$ and $CK_{180}$. $CK_{90,270}$ may be used as shorthand for the pair of clock signals $CK_0$ and $CK_{270}$. The term in-phase clocks may be used to define a differential pair of clocks $CK_{0,180}$. The term quadrature clocks may be used to define a differential pair of clocks $CK_{90,180}$. The term system clocks may be used to define the in-phase and quadrature clocks combination ($CK_{0,180,90,270}$). In various examples, the system clocks may be generated external to the described embodiments. In addition, the series switches depicted throughout the figures may be controlled by the logic signals coupled to the switch symbols. Unless specified otherwise, when the control logic is high, the switch is defined as closed. Accordingly, when the control logic is low, the switch is defined as open.

Throughout this application, the term "replica" and its conjugated forms may be defined as copied with the same circuit layout pattern(s) on a common substrate. In this application, a main multiplexer (MMUX) having a predefined circuit layout pattern may be replicated forming a replica multiplexer (RMUX) for the purpose of replicating the specific functions and timing (e.g., clock delays, signal delays, rise times, fall times) of the MMUX. Further, the RMUX may replicate or substantially emulate the MMUX timing over process, voltage and temperature.

Figure 1:
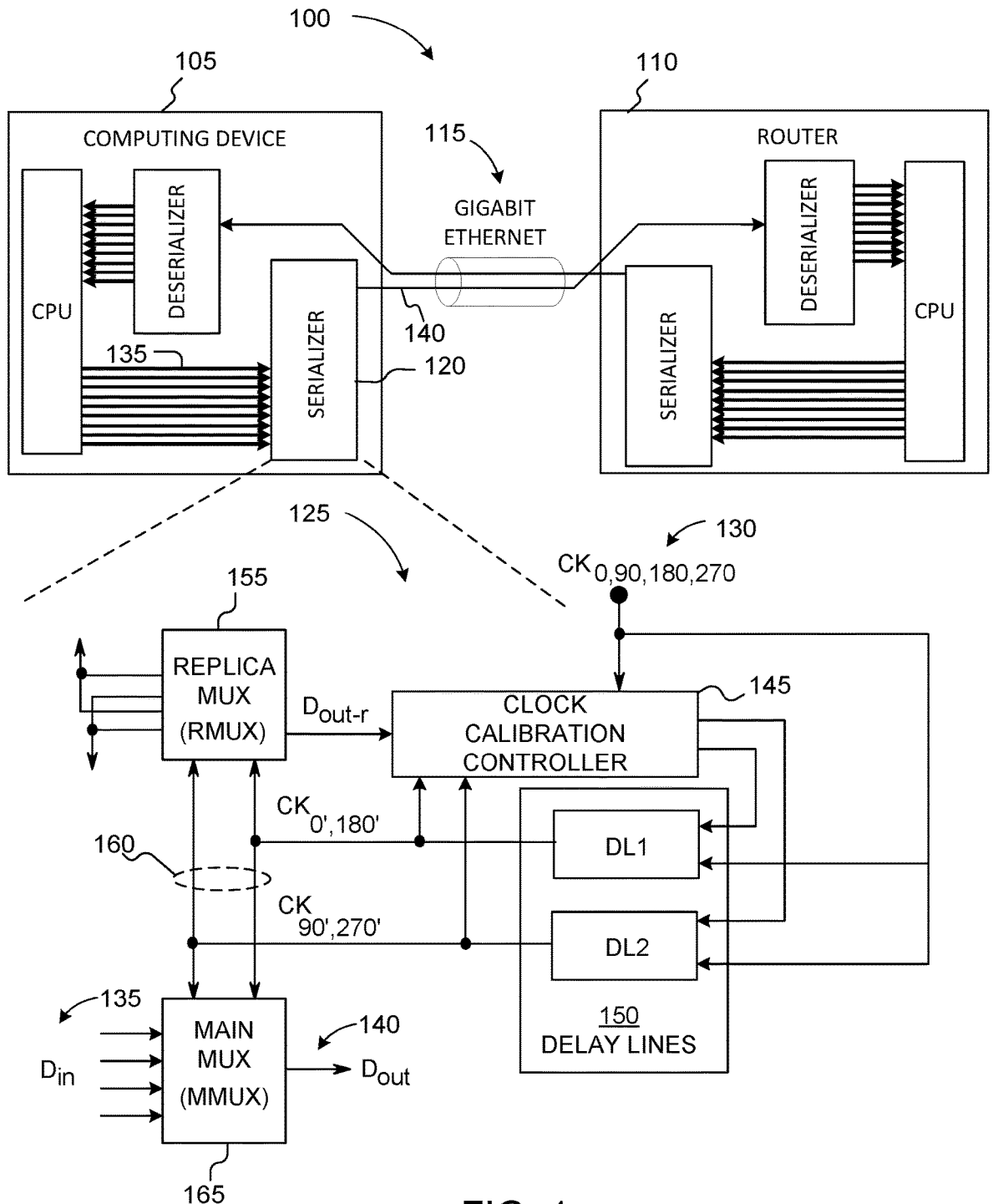
FIG. 1 depicts an exemplary multiplexer clock phase calibration module implemented within a serializer integrated circuit (IC) or module, the multiplexer clock phase calibration module increasing the reliability and noise immunity of a high-speed serializer/deserializer (SERDES) application.

FIG. 1 depicts an exemplary multiplexer clock calibration module implemented within a serializer module, the multiplexer clock calibration module increasing the reliability and noise immunity of a high-speed serializer/deserializer (SERDES) application. A computer communication application 100 includes a computing device 105 (e.g., personal computer) in communication with a router 110 over a gigabit ethernet network 115. The computing device 105 provides high-speed serial data 140 from a serializer module 120.

In the depicted example, the serializer module 120 includes a multiplexer clock calibration module 125. The multiplexer clock calibration module 125 receives a set of system clocks 130 (e.g., multiplexer clocks) and input data 135. The multiplexer clock calibration module 125 sends out serial data 140 in response to the input data 135 clocked by the set of system clocks 130 through the multiplexer clock calibration module 125.

The multiplexer clock calibration module 125 includes a clock calibration controller 145. The clock calibration controller 145 receives the set of system clocks 130, detects their deviation from an expected duty cycle, and provides an error correction signal to a delay line module 150. The clock calibration controller 145 also receives a $D_{out-r}$ signal from a replica mux 155, the signal indicative of phasing error between the set of system clocks 130 (e.g., in-phase clock set $CK_{0,180}$, quadrature clock set $CK_{90,270}$). The clock calibration controller 145 provides an error correction signal to the delay line module 150 in response to a deviation from an expected phase shift between the in-phase clock set $CK_{0,180}$ and the quadrature clock set $CK_{90,270}$.

A corrected set of clocks 160 ($CK_{0',180'}$, $CK_{90',270'}$) from the delay line module 150 are sent to the replica mux 155 for subsequent deviation determination. The multiplexer clock calibration module 125 provides iterative deviation detection and clock adjustments. The replica mux 155 may be fabricated as a substantial replica of a main mux 165. The main mux 165 receives the same corrected set of clocks 160 as the replica mux 155. The replica mux 155 replicates the timing parameters of the main mux 165. Accordingly, the main mux 165 serializes the input data 135 with the corrected set of clocks 160, thereby providing a low bit error rate. The multiplexer clock calibration module 125 may be implemented, for example, within a multi-gigabit transceiver (MGT) on a field programmable gate array (FPGA).

Figure 2:
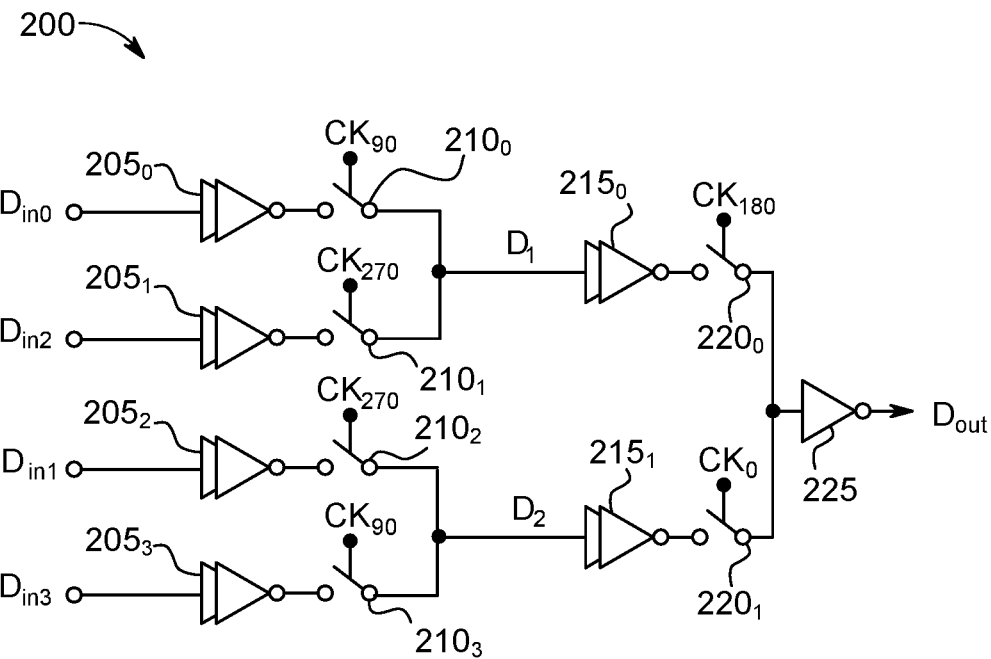
FIG. 2 depicts an exemplary 4-to-1 multiplexer implementation.
Figure 2:
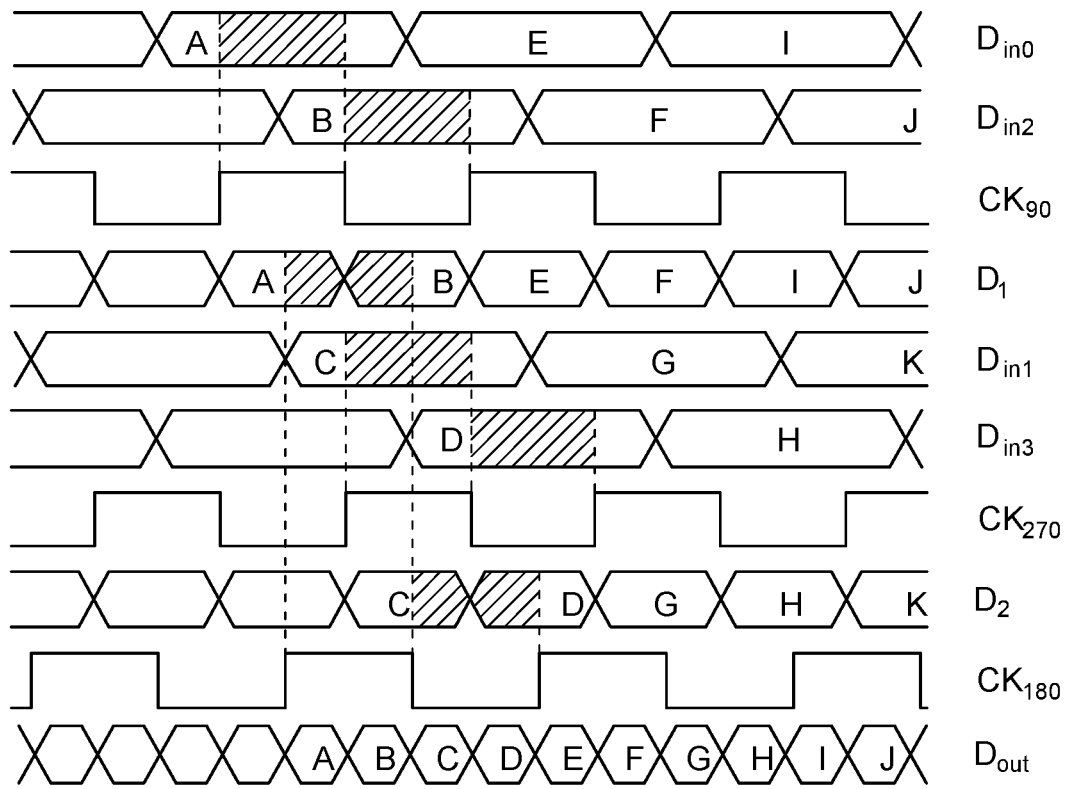

FIG. 2 depicts an exemplary 4-to-1 multiplexer implementation. A 4-to-1 data multiplexer 200 includes input buffers $205_0$, $205_1$, $205_2$, $205_3$ (hereinafter collectively referred to as "input buffers 205"). The input buffers 205 receive parallel input data $D_{in0}$, $D_{in2}$, $D_{in1}$ and $D_{in3}$. The input buffers 205 are coupled to series switches $210_0$, $210_1$, $210_2$, and $210_3$ (hereinafter collectively referred to as "series switches 210"). Series switches $210_0$ and $210_1$ are controlled by quadrature clocks $CK_{90}$ and $CK_{270}$, respectively and control the data $D_1$. Series switches $210_2$ and $210_3$ are controlled by quadrature clocks $CK_{270}$ and $CK_{90}$, respectively and control the data $D_2$.

Data $D_1$ and data $D_2$ are coupled to intermediate buffers $215_0$ and $215_1$, respectively (hereinafter collectively referred to as "intermediate buffers 215"). The intermediate buffers 215 are coupled to series switches $220_0$, $220_1$ (hereinafter collectively referred to as "series switches 220"). Series switches $220_0$ and $220_1$ are controlled by in-phase clocks $CK_{180}$ and $CK_0$, respectively and control the data to a final buffer 225. The final buffer 225 drives output data $D_{out}$.

The 4-to-1 data multiplexer 200 may pass input data $D_{in0}$ to output data $D_{out}$ when $CK_0$ and $CK_{180}$ are active (e.g., logic high) and $CK_{270}$ and $CK_0$ are inactive (e.g., logic low). The 4-to-1 data multiplexer 200 may pass input data $D_{in1}$ to output data $D_{out}$ when $CK_{270}$ and $CK_0$ are active (e.g., logic high) and $CK_0$ and $CK_{180}$ are inactive (e.g., logic low). The 4-to-1 data multiplexer 200 may pass input data Dine to output data $D_{out}$ when $CK_{270}$ and $CK_{180}$ are active (e.g., logic high) and $CK_0$ and $CK_0$ are inactive (e.g., logic low). The 4-to-1 data multiplexer 200 may pass input data Dina to output data $D_{out}$ when $CK_{90}$ and $CK_0$ are active (e.g., logic high) and $CK_{270}$ and $CK_{180}$ are inactive (e.g., logic low).

The 4-to-1 data multiplexer 200 may be a compact MUX structure. The 4-to-1 data multiplexer 200 employs quarter-rate clocks (e.g., $CK_{0,90,180,270}$) to consume natively low power. The final stage switches (series switches 220) pass two consecutive bits when $CK_0$ or $CK_{180}$ is high. Accordingly, the clocking power and the MUX output jitter both are substantially low. Simulation may be performed to demonstrate that the output jitter may be about 359 fs with about 2.4 mW power consumption, including the power consumption of a clock buffer (not shown).

Since the final stage switches (series switches 220) of this 4-to-1 data multiplexer 200 pass two bits to the output $D_{out}$ when $CK_0$ or $CK_{180}$ is high, the internal data $D_1$ and $D_2$ are directly affected by the alignment of clock phases of $CK_0$ or $CK_{180}$. If $CK_0$ or $CK_{180}$ is not aligned with the center of the data bits on $D_1$ and $D_2$, the bit width variation may appear at the output node $D_{out}$, leading to larger output data jitter.

In an illustrative example, an array of data signals may include data signals $D_{in0}$, $D_{in1}$, $D_{in2}$ and $D_{in3}$. $D_{in0}$ may be configured to connect to form a first internal node in response to $CK_{90}$. $D_{in2}$ may be configured to connect to the first internal node in response to $CK_{270}$. $D_{in1}$ may be configured to connect to form a second internal node in response to $CK_{270}$. $D_{in3}$ may be configured to connect to the second internal node in response to $CK_{90}$. The first internal node may be configured to connect to form $D_{out}$ in response to $CK_{180}$ and the second internal node may be configured to connect to form $D_{out}$ in response to $CK_0$.

Figure 3:
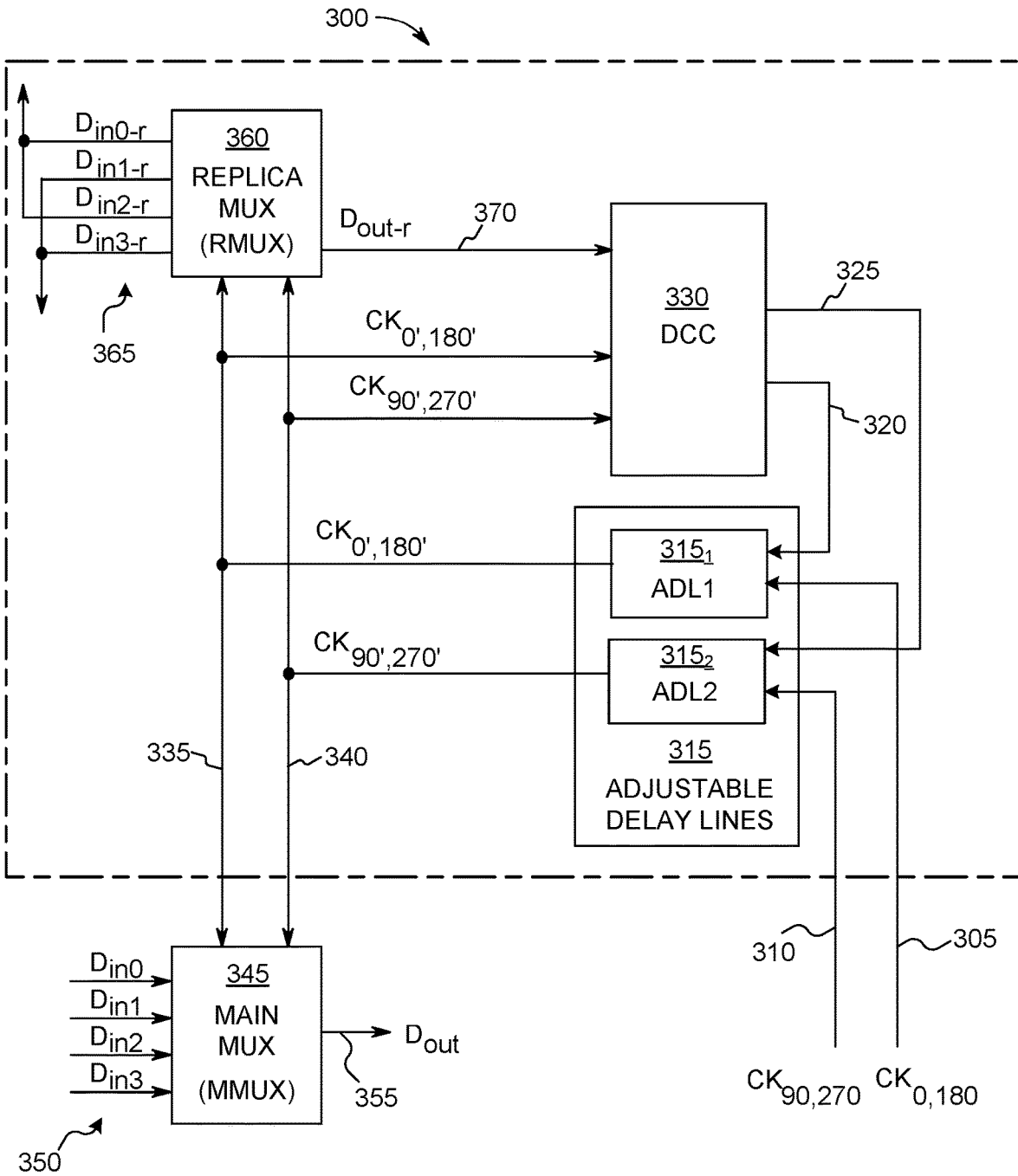
FIG. 3 depicts a multiplexer combined with an exemplary clock phase alignment module.

FIG. 3 depicts a multiplexer combined with an exemplary clock phase alignment module. A clock phase alignment module 300 receives a set of in-phase clocks ($CK_{0,180}$) 305 and a set of quadrature clocks ($CK_{90,270}$) 310. An adjustable delay line (ADL1) $315_1$ receives the in-phase clocks ($CK_{0,180}$) 305 and a correction signal 320. An adjustable delay line (ADL2) $315_2$ receives the quadrature clocks ($CK_{90,270}$) 310 and a correction signal 325. (The adjustable delay lines $315_1$ and $315_2$ may be collectively referred to as "adjustable delay lines 315.") The adjustable delay lines 315 may each include one or more delay lines, each delay line 315 operable to generate a delayed input signal. A DCC 330 generates the correction signal 320 in response to a deviation from 50% duty of a set of corrected in-phase clocks ($CK_{0',180'}$) 335. The DCC 330 generates the correction signal 325 in response to a deviation from 50% duty of a set of corrected quadrature clocks ($CK_{90',270'}$) 340. The adjustable delay line (ADL1) $315_1$ delays the leading and/or trailing edges of the in-phase clocks ($CK_{0,180}$) 305 and generates the set of corrected in-phase clocks ($CK_{0',180'}$) 335 in response to the correction signal 320. The adjustable delay line (ADL2) $315_2$ delays the leading and/or trailing edges of the quadrature clocks ($CK_{90,270}$) 310 and generates the set of corrected quadrature clocks ($CK_{90',270'}$) 340 in response to the correction signal 325. Accordingly, the corrected in-phase clocks ($CK_{0',180'}$) 335 and the corrected quadrature clocks ($CK_{90',270'}$) 340 may possess duty cycles of substantially 50%.

The adjustable delay lines 315 provide the corrected in-phase clocks ($CK_{0',180'}$) 335 and the corrected quadrature clocks ($CK_{90',270'}$) 340 to a main multiplexer (MMUX) 345. In some examples, the MMUX 345 receives the clocks 335 and 340 through a multiphase control input. The MMUX 345 serializes a parallel input data bus ($D_{in0}$, $D_{in1}$, $D_{in2}$, $D_{in3}$) 350 into a data stream ($D_{out}$) 355.

A replica multiplexer (RMUX) 360 also receives the corrected in-phase clocks ($CK_{0',180'}$) 335 and the corrected quadrature clocks ($CK_{90',270'}$) 340. In some examples, the RMUX 360 receives the clocks 335 and 340 through a multiphase control input. The RMUX 360 may be fabricated as a substantial replica of the MMUX 345, may be fabricated on a common substrate with the main multiplexer 345, and may replicate the main multiplexer 345 configuration, functions and timing properties. Accordingly, the timing associated with the data bits within the data stream ($D_{out}$) 355 may be replicas of the timing associated with the data bits within a data stream ($D_{out-r}$) 370 of the RMUX 360.

The RMUX 360 receives an input data bus ($D_{in0-r}$, $D_{in1-r}$, $D_{in2-r}$, $D_{in3-r}$) 365. The input data bus ($D_{in0-r}$, $D_{in1-r}$, $D_{in2-r}$, $D_{in3-r}$) 365 is configured to produce a data stream ($D_{out-r}$) 370 with alternating data bit logic. The data stream ($D_{out-r}$) 370 is clocked through the RMUX 360, which may be fabricated as a substantial replica of the MMUX 345. Since the RMUX 360 is fabricated on the same substrate as the replica of the MMUX 345, the configuration, functions and timing properties of the RMUX 360 may be replicas of the MMUX 345. Further, the clock-to-data phasing on the RMUX 360 may be replicas of the clock-to-data phasing on the MMUX 345. In an illustrative example, if the edges of the corrected in-phase clocks ($CK_{0',180'}$) 335 are centered about the data bits in the main serial data stream ($D_{out}$) 355, then the edges of the corrected in-phase clocks ($CK_{0',180'}$) 335 are centered about the data bits in the replica serial data stream ($D_{out-r}$) 370.

Since the data bits on the input of the RMUX 360 are configured with alternating logic, the data stream ($D_{out-r}$) 370 may generate alternating bit logic. Further, the duty cycle of the data stream ($D_{out-r}$) 370 from the RMUX 360 may be indicative of the centering of the corrected in-phase clocks ($CK_{0',180'}$) 335 with the corrected quadrature clocks ($CK_{90',270'}$) 340. The data stream ($D_{out-r}$) 370 from the RMUX 360 is sent to the DCC 330. The DCC 330 generates the correction signals 320 and/or 325, in response to the deviation from 50% duty cycle of the data stream ($D_{out-r}$) 370. Since the deviation could involve a correction delay of the in-phase clock or a correction delay of the quadrature clock, the DCC may generate the correction signals 320 and/or 325. In response to the correction signal 320, the adjustable delay line $315_1$ may adjust the phase of the corrected in-phase clocks ($CK_{0',180'}$) 335. In response to the correction signal 325, the adjustable delay line $315_2$ may further adjust the phase of the corrected quadrature clocks ($CK_{90',270'}$) 340. The corrected phase may place the clocking edges substantially centered within each data bit of the data stream ($D_{out}$) 355.

In various implementations, the correction signals 320 and 325 may each be a set of data buses. For example, the correction signals 320 and 325 may each include a bus containing a rising edge delay value and a falling edge delay value. Accordingly, the adjustable delay lines 315 may adjust the phases of the clocks 335, 340 by changing the delay of rising edges and falling edges by the same amount. Further, the adjustable delay lines 315 may adjust the duty cycle of the corrected in-phase clocks ($CK_{0',180'}$) 335 and the corrected quadrature clocks ($CK_{90',270'}$) 340 by changing the delay of the rising and falling edges.

In various examples, the clock phase alignment module 300 may produce continuously duty-balanced and phase-aligned in-phase and quadrature clocks. The duty-balanced and phase-aligned clocks may advantageously reduce jitter in various serializer-deserializer (SERDES) applications. The implementation depicted in FIG. 3 may be a clock phase calibrated multiplexer, for example.

Figure 4A:
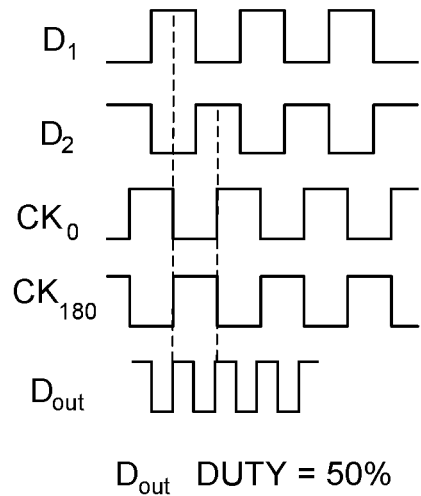
FIGS. 4A, 4B and 4C depict output data streams from an exemplary multiplexer circuit with variable duty cycle in response to variable clock phase.
Figure 4B:
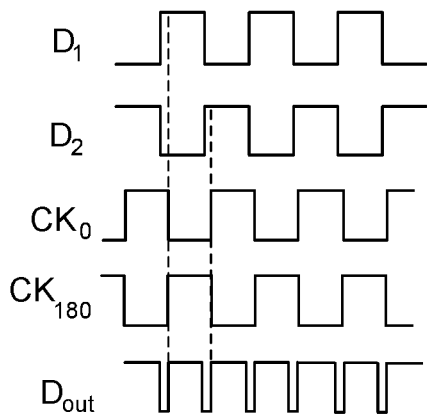
Figure 4C:
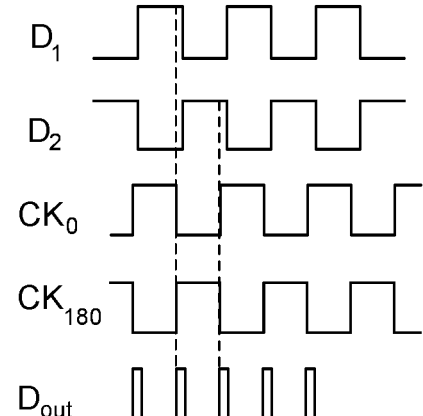

FIGS. 4A, 4B and 4C depict output data streams from an exemplary multiplexer circuit with variable output duty cycle in response to variable clock phase. An in-phase clock ($CK_0$) and an inverted in-phase clock ($CK_{180}$) multiplex a data signal $D_1$ and a data signal $D_2$ through the multiplexer 200 depicted in FIG. 2. The multiplexer 200 may represent the logic configuration of the MMUX 345 and the RMUX 360. On multiplexer 200 in FIG. 3, when the data inputs $D_{in0}$ and $D_{in1}$ are tied high, and $D_{in1}$ and Dina are tied low, a data stream may be produced on $D_1$ and $D_2$ with data that transitions to an opposite logic level on every transition of the quadrature clocks $CK_0$ and $CK_{270}$.

The exemplary waveforms of FIGS. 4A, 4B and 4C may be generated from the multiplexer 200 with data inputs $D_{in0}$ and $D_{in1}$ tied high, and $D_{in1}$ and Dina tied low. In operation, with reference to FIGS. 4A, 4B and 4C, when in-phase clock $CK_0$ is low, data signal $D_1$ is passed to $D_{out}$ in real-time. Further, when inverted in-phase clock $CK_{180}$ is high, data signal $D_2$ is passed to $D_{out}$ in real time. Since the data signals $D_1$ and $D_2$ pass through series switches 220, actual data signals, including the data transitions, are selectively passed from $D_1$ to $D_{out}$ or from $D_2$ to $D_{out}$.

Accordingly, the $D_{out}$ signal produces a duty cycle in response to the nearness of the edges of the in-phase clocks $CK_0$ and $CK_{180}$ to the center of the transitions on $D_1$ and $D_2$. The closer the clocking edges of the in-phase clock $CK_0$ and $CK_{180}$ edges are to the mid-point between the transitions of the data signals $D_1$ and $D_2$, the closer the duty cycle of $D_{out}$ becomes to 50%. The duty cycle of $D_{out}$ is indicative of the centering of the clock(s) with the data boundaries in the data signals $D_1$ and $D_2$.

As depicted in FIG. 4A, the in-phase clock $CK_0$ is centered about the transitions on $D_1$ and $D_2$. The transitions on $D_1$ and $D_2$ may represent the transitions of the quadrature clock (FIG. 2, $CK_{90}$ and $CK_{270}$). Various clock phase alignment module embodiments may be operable to regulate the phase of the in-phase clocks ($CK_0$, and $CK_{180}$) to be substantially centered between the transitions of the quadrature clock ($CK_{90}$, and $CK_{270}$) such that $D_{out}$ produces a duty cycle of substantially 50%.

As depicted in FIG. 4B, the in-phase clock $CK_0$ is early with respect to the mid-point of the transitions on data signals $D_1$ and $D_2$. In this example, $D_{out}$ produces a duty cycle of greater than 50% in response to the in-phase clock arriving early.

As depicted in FIG. 4C, the in-phase clock $CK_0$ is late with respect to the mid-point of the transitions on data signals $D_1$ and $D_2$. In this example, $D_{out}$ produces a duty cycle of less than 50% in response to the in-phase clock arriving late.

In some examples, the data inputs may be configured opposite as described in FIGS. 4A-4C, such that $D_{in0}$ and $D_{in2}$ are logic low, and $D_{in1}$ and Dina are logic high. In such examples, the data signals $D_1$ and $D_2$ may be inverted from those described in FIGS. 4A-4C. In the case of the in-phase clock coming early, as depicted in FIG. 4B, the duty cycle of $D_{out}$ may be less than 50%. In the cases where the in-phase clock coming late, as depicted in FIG. 4C, the duty cycle of $D_{out}$ may be greater than 50%. The corresponding downstream circuits may be implemented with reverse logic to achieve the same overall results.

FIGS. 4A, 4B and 4C depict the details of the replica multiplexer (RMUX) 360 operation. In an illustrative example, by connecting the inputs of the RMUX 360 to alternating logic (e.g., $D_{in0-r}$ and $D_{in2-r}$ to logic high, $D_{in1-r}$ and $D_{in3-r}$ to logic low), 14-GHz clock waveforms, for example, may generated at the data signals (internal nodes) $D_1$ and $D_2$ of the RMUX 360. If $CK_{0,180}$ is substantially centered with the data signal $D_1$ and $D_2$ transitions, then the RMUX 360 output, data stream ($D_{out-r}$) 370 may be a 28-GHz signal with a duty cycle of substantially 50%. In contrast, the RMUX 360 output may produce a duty cycle on data stream ($D_{out-r}$) 370 of greater than 50% or less than 50% in response to the early or late clock edges on $CK_{0,180}$.

Figure 5:
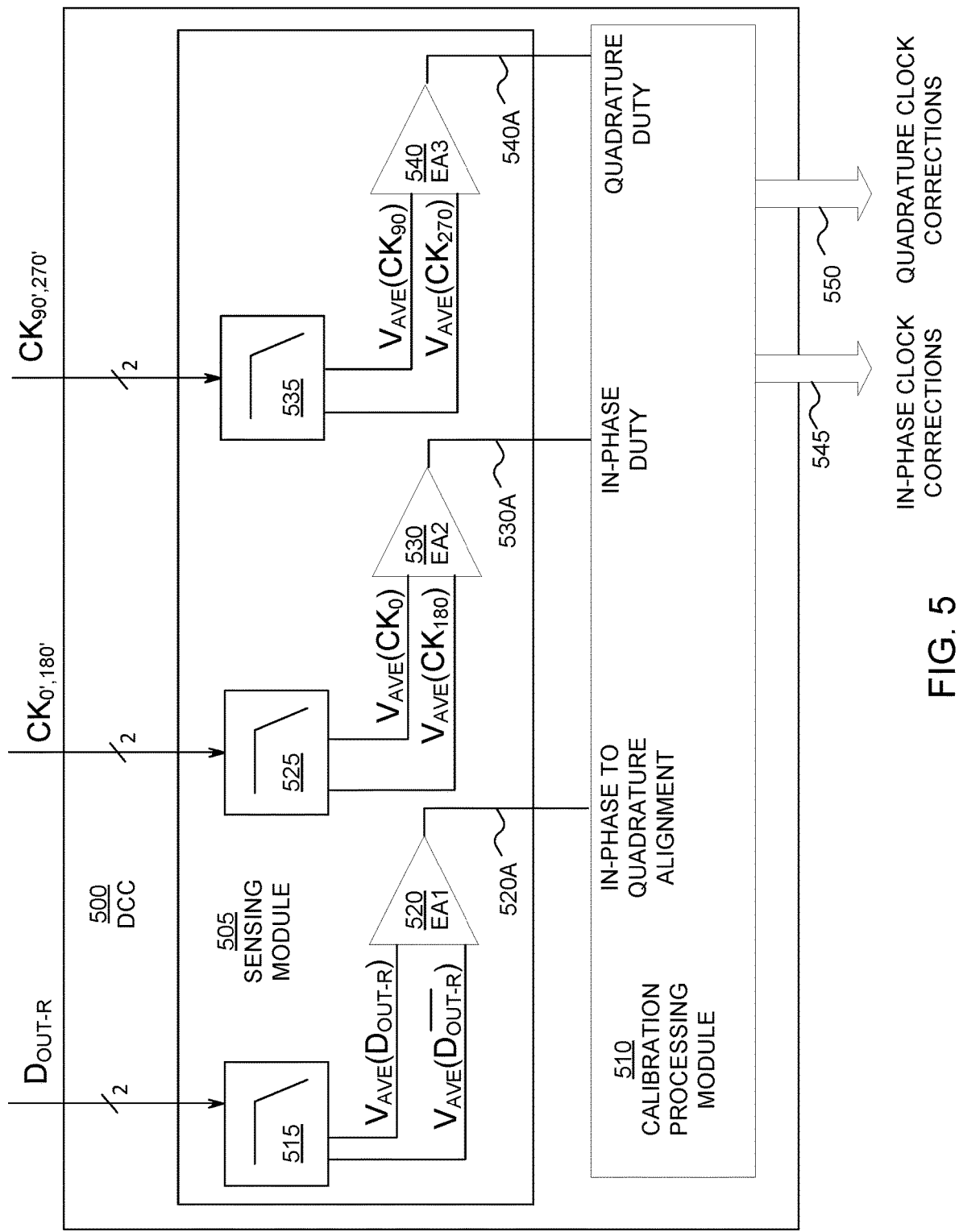
FIG. 5 depicts an exemplary duty cycle calibration module.
Figure 6A:
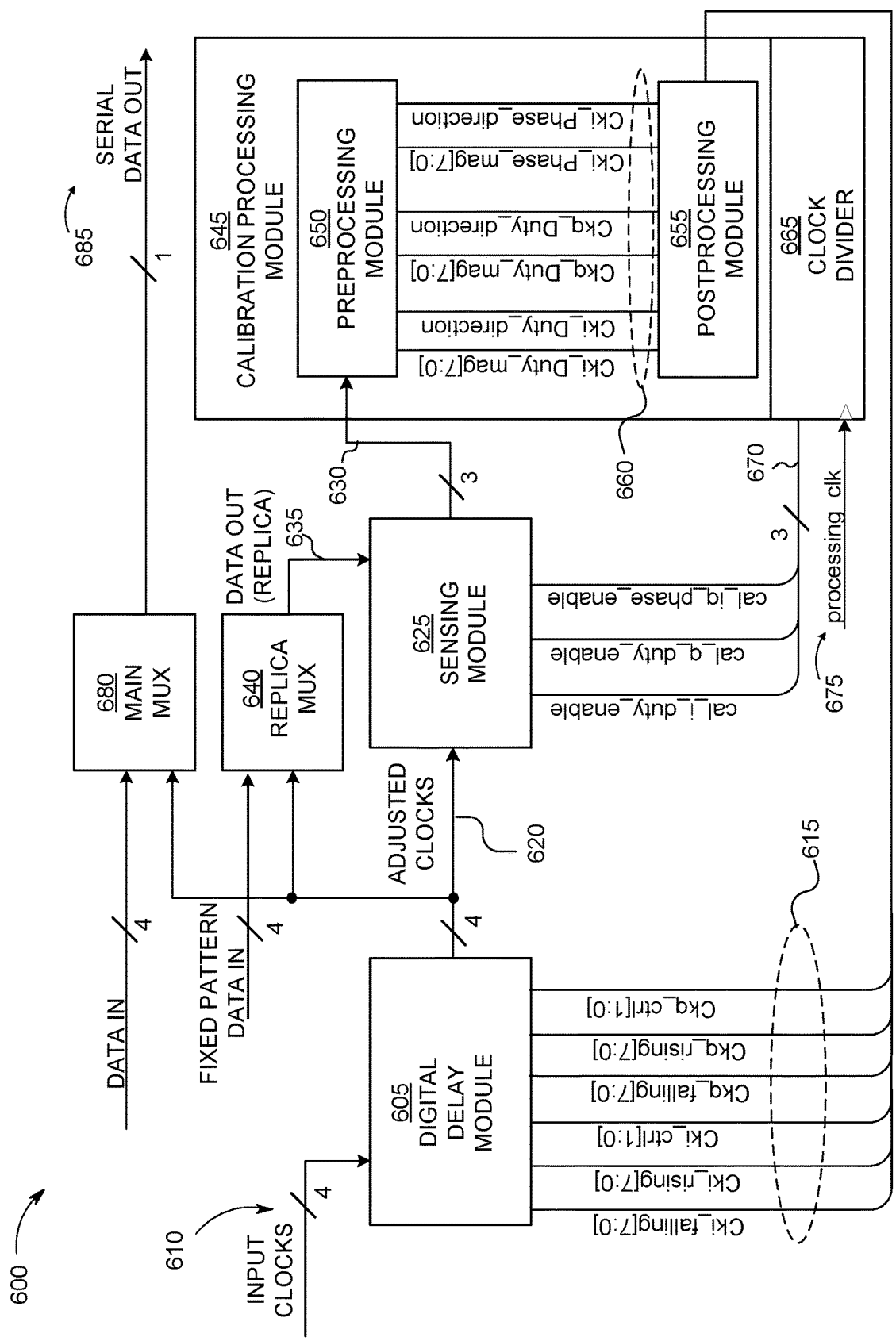
FIGS. 6A and 6B depicts an exemplary clock phase alignment module.
Figure 6B:
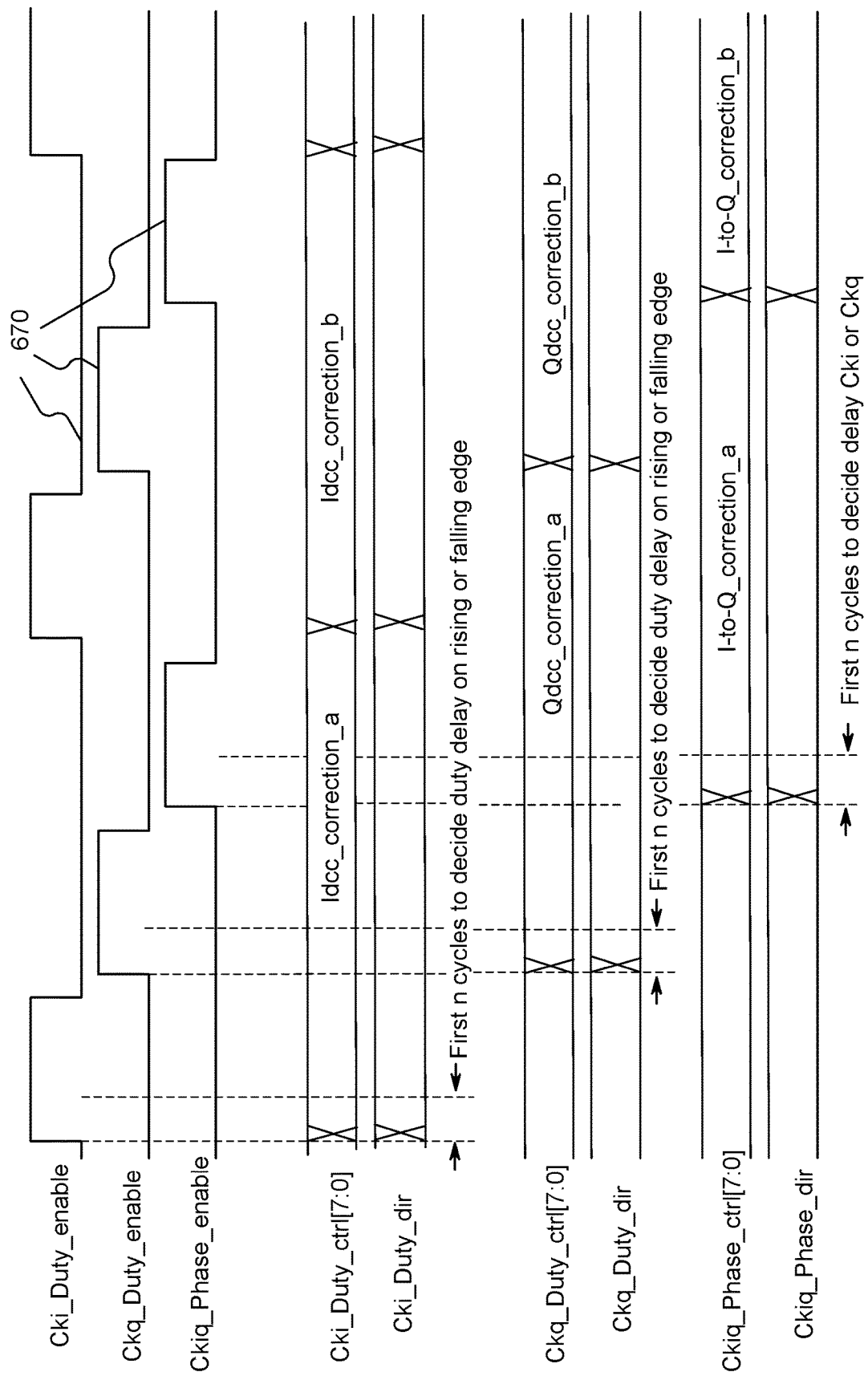

FIG. 5 depicts an exemplary duty cycle calibration module (DCC). A duty cycle calibration module (DCC) 500 includes a sensing module 505 and a calibration processing module 510. In some examples, the DCC 500 may be the DCC 330 (FIG. 3). The sensing module 505 receives one or more differential pairs. In the depicted example, the sensing module 505 receives a $D_{out-r}$ differential pair, a $CK_{0,180}$ differential pair and a $CK_{90,270}$ differential pair.

The $D_{out-r}$ differential pair is generated by the RMUX (FIG. 3, item 360). The $D_{out-r}$ differential pair is filtered by a low-pass filter (LPF) 515. The LPF 515 generates a pair of average voltages $V_{AVE}(D_{out-r})$ and $V_{AVE}(D_{out-r})$ bar. The average voltages are sent to an error amplifier 520, where an error signal 520A is generated indicative of the phase shift of the in-phase clocks ($CK_{0,180}$) with respect to the quadrature clocks ($CK_{90,270}$) alignment.

In an illustrative example, the sensing module 505 may be configured to generate a zero error signal 520A when the in-phase clocks ($CK_{0,180}$) are 90 degrees phase shifted from the quadrature clocks ($CK_{90,270}$). A 90° phase shift may indicate optimal alignment. The sensing module 505 may be configured to generate a positive error signal 520A when the in-phase clocks ($CK_{0,180}$) are less than 90° phase shifted from the quadrature clocks ($CK_{90,270}$), and a negative error signal 520A when the in-phase clocks ($CK_{0,180}$) are more than 90° phase shifted from the quadrature clocks ($CK_{90,270}$). In response to a positive error, for example, the rising and falling edges of $CK_0$ (and the associated rising and falling edges of $CK_{180}$) may be delayed simultaneously to increase the phase shift of the in-phase clocks. Accordingly, in response to a negative error, for example, the rising and falling edges of $CK_0$ (and the associated rising and falling edges of $CK_{270}$) may be delayed simultaneously to increase the phase shift of the quadrature clocks. The error signal 520A may include a magnitude indicative of the deviation from 90°.

The $CK_{0,180}$ differential pair is filtered by an LPF 525. The LPF 525 generates a pair of average voltages $V_{AVE}(CK_0)$ and $V_{AVE}(CK_{180})$. The average voltages are sent to an error amplifier 530, where an error signal 530A is generated indicative of the duty cycle of the $CK_{0,180}$ differential pair.

In an illustrative example, the sensing module 505 may be configured to generate a zero error signal 530A when the $CK_{0,180}$ differential pair is at 50% duty cycle. The sensing module 505 may be configured to generate a positive error signal 530A when the duty cycle of the $CK_{0,180}$ differential pair is greater than 50%, and a negative error signal 530A when the duty cycle of the $CK_{0,180}$ differential pair is less than 50%. In response to a positive error, for example, the rising edge of $CK_0$ (and the associated falling edge of $CK_{180}$) may be delayed to decrease the in-phase clock duty cycle. Accordingly, in response to a negative error, for example, the falling edge of $CK_0$ (and the associated rising edge of $CK_{180}$) may be delayed to increase the in-phase clock duty cycle. The error signal 530A may include a magnitude indicative of the deviation from 50% duty cycle.

The $CK_{90,270}$ differential pair is filtered by a LPF 535. The LPF 535 generates a pair of average voltages $V_{AVE}(CK_{90})$ and $V_{AVE}(CK_{270})$. The average voltages are sent to an error amplifier 540, where an error signal 540A is generated indicative of the duty cycle of the $CK_{90,270}$ differential pair.

In an illustrative example, the sensing module 505 may be configured to generate a zero error signal 540A when the $CK_{90,270}$ differential pair is at 50% duty cycle. The sensing module 505 may be configured to generate a positive error signal 540A when the duty cycle of the $CK_{90,270}$ differential pair is greater than 50%, and a negative error signal 540A when the duty cycle of the $CK_{90,270}$ differential pair is less than 50%. In response to a positive error, for example, the rising edge of $CK_0$ (and the associated falling edge of $CK_{270}$) may be delayed to decrease the quadrature clock duty cycle. Accordingly, in response to a negative error, for example, the falling edge of $CK_0$ (and the associated rising edge of $CK_{270}$) may be delayed to increase the quadrature clock duty cycle. In some examples, the error signal 540A may include a magnitude indicative of the deviation from 50% duty cycle.

The calibration processing module 510 receives the error signals 520A, 530A and 540A. The calibration processing module 510 generates an in-phase clock correction signal 545 and a quadrature clock correction signal 550.

In an illustrative example, the in-phase clock correction signal 545 may include one or more digital control and data buses. The digital control and data buses may include a time delay magnitude, for both rising and falling edges, which may be sent to the delay line module, such as adjustable delay line (ADL1) $315_1$ (FIG. 3), and in this way the duty cycle and the phase of the in-phase clock may be adjusted.

In an illustrative example, the quadrature clock correction signal 550 may include one or more digital control and data buses. The digital control and data buses may include a time delay magnitude, for both rising and falling edges, which may be sent to the delay line module, such as adjustable delay line (ADL2) $315_2$ (FIG. 3), and in this way the duty cycle and the phase of the in-phase clock may be adjusted.

FIGS. 6A and 6B depict a block diagram and associated timing diagram of an exemplary clock phase alignment module. With reference to FIG. 6A, a clock phase alignment module 600 includes a digital delay module 605. The clock phase alignment module 600 may be operable to adjust one or more input clocks 610. The input clocks 610 may include an in-phase differential pair (e.g., $CK_0$, $CK_{180}$) and a quadrature differential pair ($CK_{90}$, $CK_{270}$). The adjustment to the input clocks 610 may be controlled by a delay control signal 615. In the depicted example the delay control signal 615 includes one or more delay module control data buses. The digital delay module 605 may generate a set of adjusted clocks 620 (which may be defined as in-phase adjusted clocks $CK_{0'}$, $CK_{180'}$ and the quadrature adjusted clocks $CK_{90'}$, $CK_{270'}$) by adjusting the delay of a rising and/or a falling edge of the set of input clocks 610 in response to the delay control signal 615. Accordingly, the set of adjusted clocks 620 may reflect the set of input clocks 610 with duty cycle and phase adjustments.

A sensing module 625 receives the adjusted clocks 620 and a data output signal 635 generated by a replica mux 640. The data output signal 635 may represent a phase alignment between the in-phase clocks and the quadrature clocks. The sensing module 625 may generate duty cycle sense signals 630 indicative of the duty cycles of (1) the in-phase adjusted clocks $CK_{0'}$, $CK_{180'}$, (2) the quadrature adjusted clocks $CK_{90'}$, $CK_{270'}$, and (3) the data output signal 635.

A calibration processing module 645 receives the duty cycle sense signals 630 generated by the sensing module 625. The calibration processing module 645 generates the delay control signal 615 based on the duty cycle sense signals 630.

In the depicted example, the calibration processing module 645 includes a preprocessing module 650 and a post-processing module 655. The preprocessing module 650 generates a set of magnitude and direction signals 660 in response to each of the received duty cycle sense signals 630. The postprocessing module 655 generates the delay control signal 615 in response to the set of magnitude and direction signals 660. The delay control signal 615 may include one or more delay module control data buses. The calibration processing module 645 may generate the delay control signal 615 based on a duty cycle sense signal.

The calibration processing module 645 includes a clock divider 665. The clock divider 665 generates one or more enable signals 670 in response to a processing clock 675. The enable signals 670 may activate the three functions (in-phase clocks duty cycle, quadrature clocks duty cycle, phase duty cycle) within the sensing module 625 in repeating succession.

In various examples, each of three enable signals 670 may activate during one or more processing clocks 675 in a repeating pattern. Further, the enable signals 670 may select one of the sense signals from the sensing module 625 as the output to the duty cycle sense signal 630.

For example, during the first enable signal (cal_i_duty_enable), the duty cycle sense signal 630 may be the resulting LPF sense signal of the in-phase clocks ($CK_{0,180}$). The preprocessing module 650 within the calibration processing module 645 may determine the magnitude and direction signal 660 of the in-phase clock based on the received duty cycle sense signal 630. The postprocessing module 655 within the calibration processing module 645 may receive the magnitude and direction signal 660 and generate a delay magnitude for the in-phase clock edges (e.g., cki_falling[7:0], cki_rising[7:0]). During this first enable signal (cal_i_duty_enable), the calibration processing module 645 may execute this determination eight times, for example, each determination lasting 16 processing clocks.

Next, during the second enable signal (cal_q_duty_enable), the duty cycle sense signal 630 may be the resulting LPF sense signal of the quadrature clock. The preprocessing module 650 within the calibration processing module 645 may determine the magnitude and direction signal 660 of the quadrature clock based on the received duty cycle sense signal 630. The postprocessing module 655 within the calibration processing module 645 may receive the magnitude and direction signal 660 and generate a delay magnitude for the quadrature clock edges (e.g., ckq_falling[7:0], ckq_rising[7:0]). During this second enable signal (cal_q_duty_enable), the calibration processing module 645 may execute this determination eight times, for example, each determination lasting 16 processing clocks.

Finally, during the third enable signal (cal_iq_phase_enable), the duty cycle sense signal 630 may be the resulting LPF sense signal of the data output signal 635 generated by the replica mux 640. The preprocessing module 650 within the calibration processing module 645 may determine the magnitude and direction signals 660 of the data output signal 635 generated by the replica mux 640 based on the received duty cycle sense signal 630. The postprocessing module 655 within the calibration processing module 645 may receive the magnitude and direction signals 660 and generate a common delay magnitude for the in-phase and quadrature clock edges (e.g., cki_falling[7:0], cki_rising[7:0], ckq_falling[7:0], ckq_rising[7:0]). During this third enable signal (cal_iq_phase_enable), the calibration processing module 645 may execute this determination eight times, for example, each determination lasting 16 processing clocks.

The replica mux 640 is a replica of a main mux 680. In various examples, the clock phase alignment module 600 may generate the set of adjusted clocks 620, which may be a corrected copy of the input clocks 610 with adjusted duty cycle and phase. The main mux 680 may produce a serial output data steam 685 with reduced jitter in response to the set of adjusted clocks 620.

With reference to FIG. 6B, a timing diagram of the exemplary clock phase alignment module 600 includes sequential enable signals 670. As described in FIG. 6A, the enable signals activate one of three functions in the duty cycle sensing module 625.

As depicted in the example of FIG. 6B, when the cki_Duty_enable is active (e.g., high), the duty cycle of the in-phase clocks (as denoted by the "i" in the signal name cki_Duty_enable) may be sensed and evaluated in the sensing module 625. The sensing module 625 may generate the duty cycle sense signal 630 with the in-phase clock duty LPF value and send the value to the calibration processing module 645. In various examples, the calibration processing module 645 may allow a number of cycles to elapse (denoted as "n" cycles in FIG. 6B) to allow the in-phase clock duty LPF value to stabilize. The calibration processing module 645 may generate the delay control signal 615 by converting the duty cycle sense signal 630 to a correction value, cki_Duty_cntl[7:0] and cki_Duty_dir.

When the ckq_Duty_enable is active (e.g., high), the duty cycle of the quadrature clocks (as denoted by the "q" in the signal name ckq_Duty_enable) may be sensed and evaluated in the sensing module 625. The sensing module 625 may generate the duty cycle sense signal 630 with the quadrature clock duty LPF value and send the value to the calibration processing module 645. In various examples, the calibration processing module 645 may allow a number of cycles to elapse (denoted as "n" cycles in FIG. 6B) to allow the quadrature clock duty LPF value to stabilize. The calibration processing module 645 may generate the delay control signal 615 by converting the duty cycle sense signal 630 to a correction value, ckq_Duty_cntl[7:0] and ckq_Duty_dir.

When the ckiq_Phase_enable is active (e.g., high), the duty cycle indicative of the in-phase to quadrature phasing, such as the data output signal 635, may be sensed and evaluated in the sensing module 625. The sensing module 625 may generate the duty cycle sense signal 630 with the in-phase to quadrature phasing duty LPF value and send the value to the calibration processing module 645. In various examples, the calibration processing module 645 may allow a number of cycles to elapse (denoted as "n" cycles in FIG. 6B) to allow the in-phase to quadrature phasing duty LPF value to stabilize. The calibration processing module 645 may generate the delay control signal 615 by converting the duty cycle sense signal 630 to a correction value, ckiq_Phase_cntl[7:0] and ckiq_Phase_dir. In some examples, the calibration processing module 645 may generate the delay control signal 615 by converting the duty cycle sense signal 630 to a correction value, ckq_Phase_cntl[7:0] and ckq_Phase_dir. Accordingly, the relative phase of the clocks can be adjusted by delaying the rising and falling edges of the in-phase and/or the quadrature clocks simultaneously.

In various examples, the number of clock cycles for the stabilization time, as denoted by the first "n" samples after the enable signals 670 activation may be different for each function. For example, stabilization for the in-phase clock duty sense may be 5 clocks, the stabilization time for the quadrature clock duty sense may be 10 clocks and the stabilization time for the phase sense duty may be 12 clocks.

The calibration processing module 645 may control the sensing module 625 via the enable signals 670 to indicate which parameter (e.g., in-phase clocks, quadrature clocks, phasing between in-phase and quadrature clocks) is to be sampled and corrected. The calibration processing module 645 may enable the parameters in a sequential repeating fashion as depicted in FIG. 6B. The repeating corrections to the parameters (e.g., in-phase clocks, quadrature clocks, phasing between in-phase and quadrature clocks) may provide real-time compensation of supply and temperature variation.

In some examples, the enables may be activated asymmetrically. For example, the calibration processing module 645 may enable in-phase clock duty cycle sense (ID), the quadrature clock duty cycle sense (QD) then go back to ID, then QD before activating the in-phase to quadrature phasing (IQP). This principle may be expanded further, the calibration processing module 645 producing an enable sequence of ID, QD, ID, QD, ID, QD, before activating IQP, for example. In various implementations, the enables may be activated in a different order, the calibration processing module 645 producing an enable sequence of QD, ID, IQP, for example. In some examples, the calibration processing module 645 may determine an enable sequence that is based on other factors such as the comparative magnitude of the duty cycle error signals, or die temperature, rather than a set pattern, for example.

In an illustrative example, the cki_Duty_dir and ckq_Duty_dir signals may indicate 0 for increase duty cycle and 1 for decrease duty cycle. Further, the ckiq_Phase_dir may indicate 0 for delay the in-phase clock paths and 1 for delay the quadrature clock paths.

Figure 7:
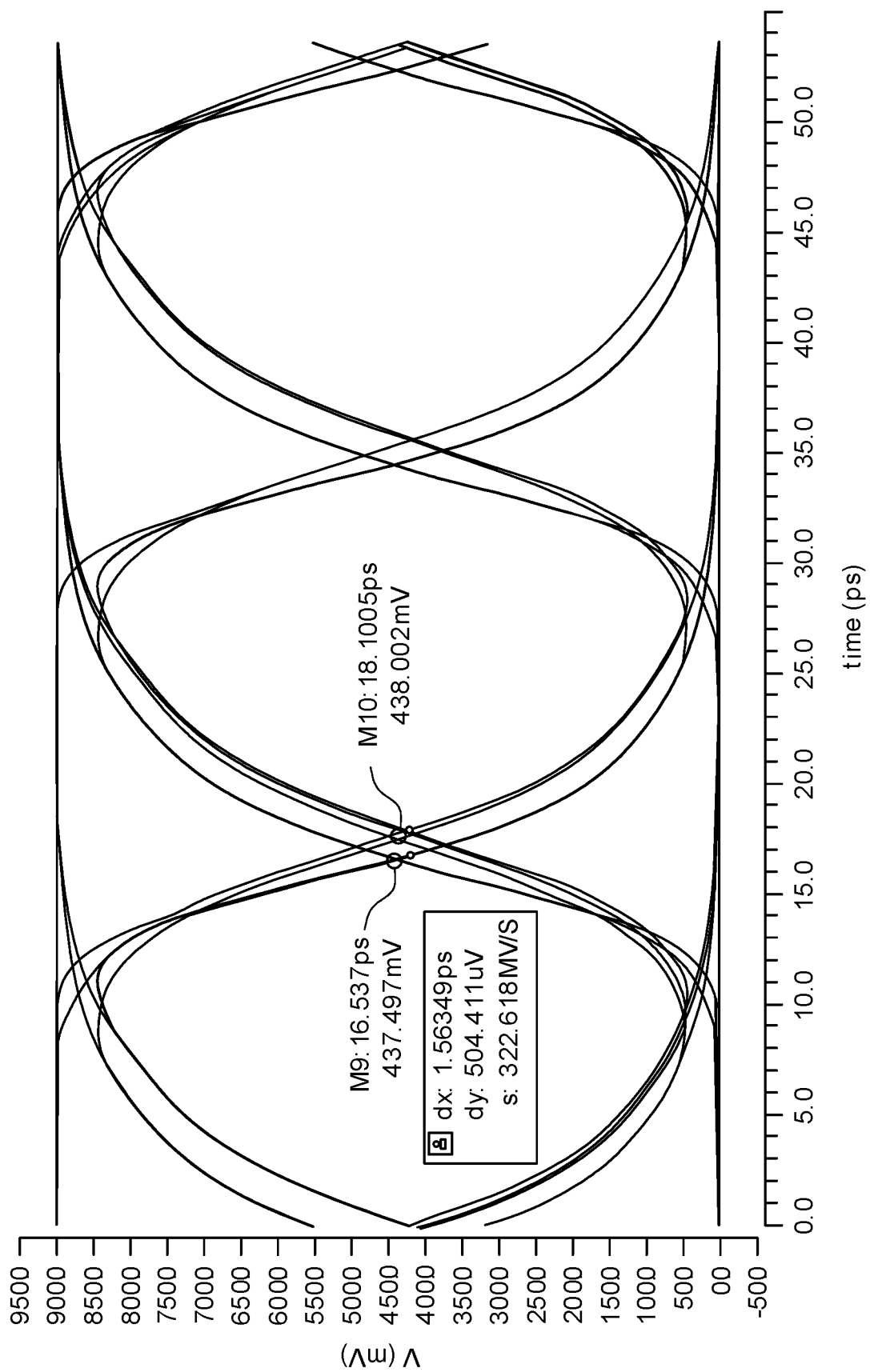
FIG. 7 depicts an exemplary eye-diagram demonstrating clock jitter without the multiplexer clock phase calibration module.

FIG. 7 depicts an exemplary eye-diagram demonstrating clock jitter without the multiplexer clock phase calibration module. In the depicted example, the jitter measurement is 1.563 picoseconds.

Figure 8:
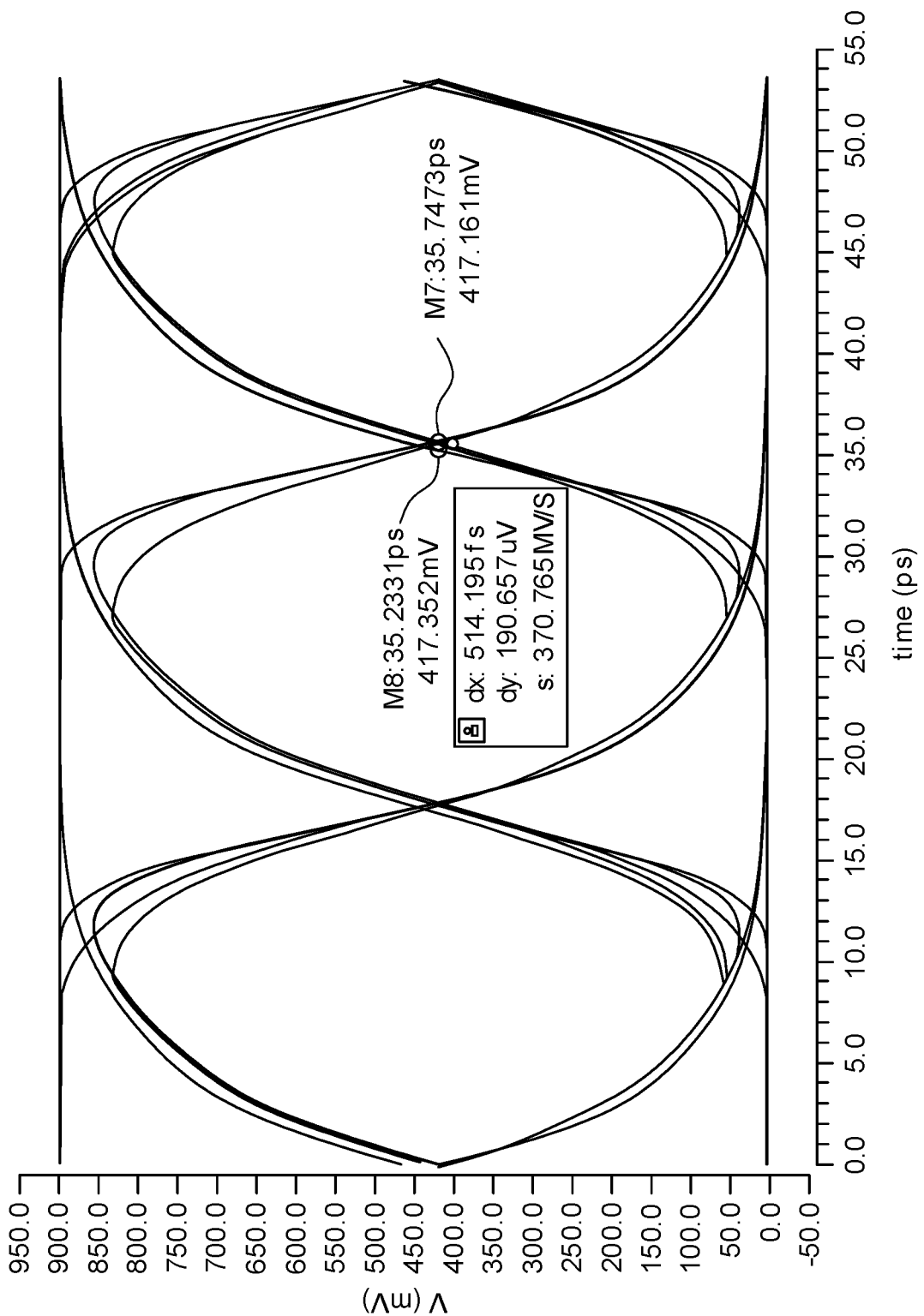
FIG. 8 depicts an exemplary eye-diagram demonstrating clock jitter with the multiplexer clock phase calibration module.

FIG. 8 depicts an exemplary eye-diagram demonstrating clock jitter with the multiplexer clock phase calibration module. In the depicted example, the jitter measurement is 0.514 picoseconds. With reference to FIG. 7 the measurement of FIG. 8 represents a jitter reduction of about 67%.

Figure 9A:
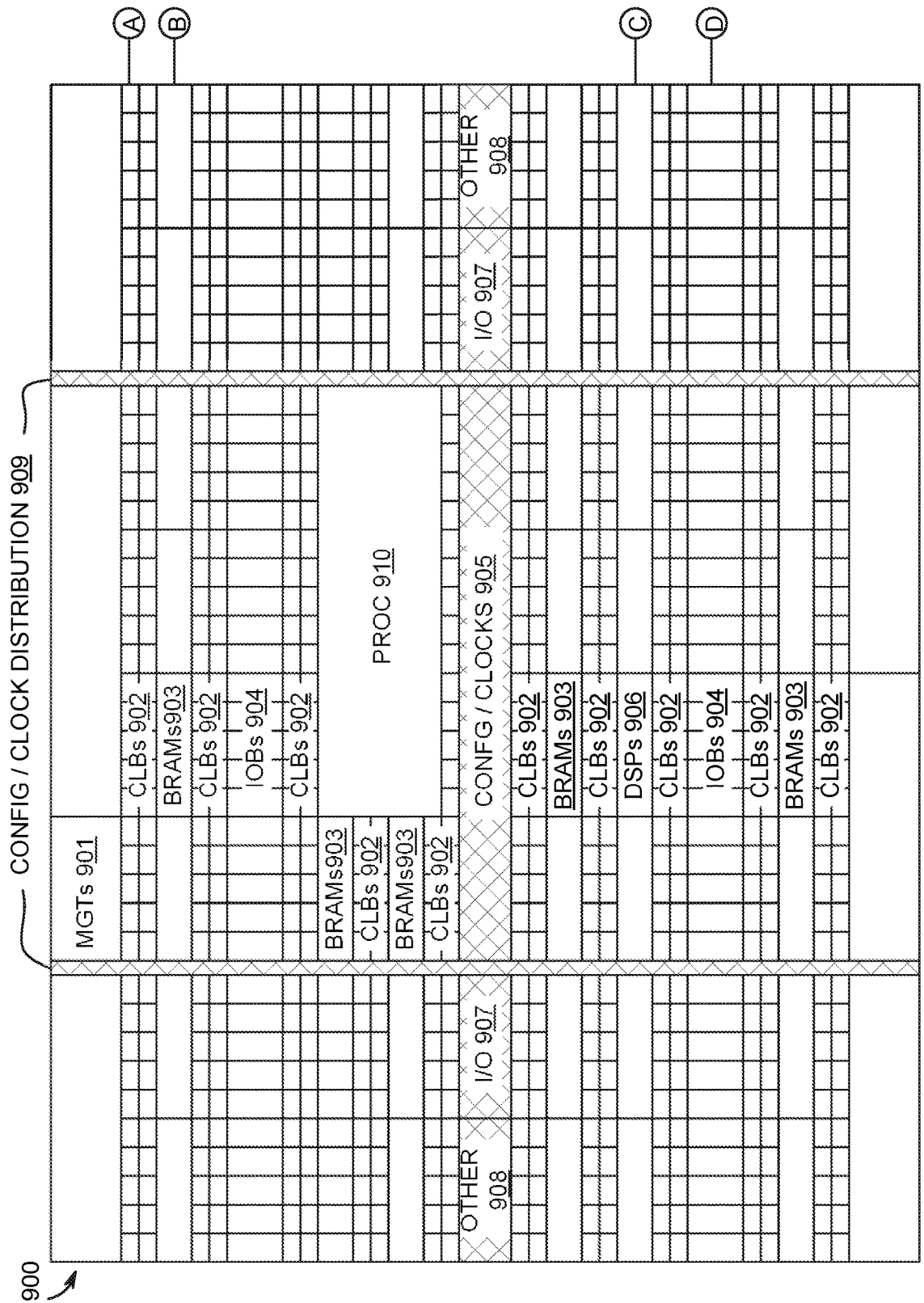

FIGS. 9A and 9B depict an exemplary programmable integrated circuit (IC) on which the disclosed circuits and processes may be implemented. FIGS. 9A and 9B will be described in combination. The connections between FIGS. 9A and 9B are depicted as circle points A, B, C and D. A programmable IC 900 includes field programmable gate array (FPGA) logic. The programmable IC 900 may be implemented with various programmable resources and may be referred to as a System on Chip (SOC). FPGA logic may include several diverse types of programmable logic blocks in the array.

For example, FIG. 9A and FIG. 9B illustrate a programmable IC 900 that includes a large number of different programmable tiles including multi-gigabit transceivers (MGTs) 901, configurable logic blocks (CLBs) 902, blocks of random access memory (BRAMs) 903, input/output blocks (IOBs) 904, configuration and clocking logic (CONFIG/CLOCKS) 905, digital signal processing blocks (DSPs) 906, specialized input/output blocks (I/O) 907 (e.g., clock ports), and other programmable logic 908 (e.g., digital clock managers, analog-to-digital converters, system monitoring logic). The programmable IC 900 includes dedicated processor blocks (PROC) 910. The programmable IC 900 may include internal and external reconfiguration ports (not shown).

In various examples, a serializer/deserializer may be implemented using the MGTs 901. The MGTs 901 may include various data serializers and deserializers. Data serializers may include various multiplexer implementations. Data deserializers may include various demultiplexer implementations.

In some examples of FPGA logic, each programmable tile includes a programmable interconnect element (INT) 911 having standardized inter-connections 924 to and from a corresponding interconnect element in each adjacent tile. Therefore, the programmable interconnect elements taken together implement the programmable interconnect structure for the illustrated FPGA logic. The programmable interconnect element INT 911 includes the intra-connections 920 to and from the programmable logic element within the same tile, as shown by the examples included in FIG. 9B. The programmable interconnect element INT 911 includes the inter-INT-connections 922 to and from the programmable interconnect element INT 911 within the same tile, as shown by the examples included in FIG. 9B.

For example, a CLB 902 may include a configurable logic element (CLE) 912 that may be programmed to implement user logic, plus a single programmable interconnect element INT 911. A BRAM 903 may include a BRAM logic element (BRL) 913 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 906 may include a DSP logic element (DSPL) 914 and one or more programmable interconnect elements. An IOB 904 may include, for example, two instances of an input/output logic element (IOL) 915 and one instance of the programmable interconnect element INT 911. The actual I/O bond pads connected, for example, to the I/O logic element 915, may be manufactured using metal layered above the various illustrated logic blocks, and may not be confined to the area of the input/output logic element 915.

In the pictured implementation, a columnar area near the center of the die (shown shaded in FIG. 9A) is used for configuration, clock, and other control logic. Horizontal areas 909 extending from the column distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 9A and FIG. 9B include additional logic blocks that disrupt the regular columnar structure making up a large part of the programmable IC. The additional logic blocks may be programmable blocks and/or dedicated logic. For example, the processor block PROC 910 shown in FIG. 9A spans several columns of CLBs 902 and BRAMs 903.

Note that FIG. 9A and FIG. 9B are intended to illustrate only an example of programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 902 may be included wherever the CLBs 902 appear, to facilitate the efficient implementation of user logic.

Figure 10:
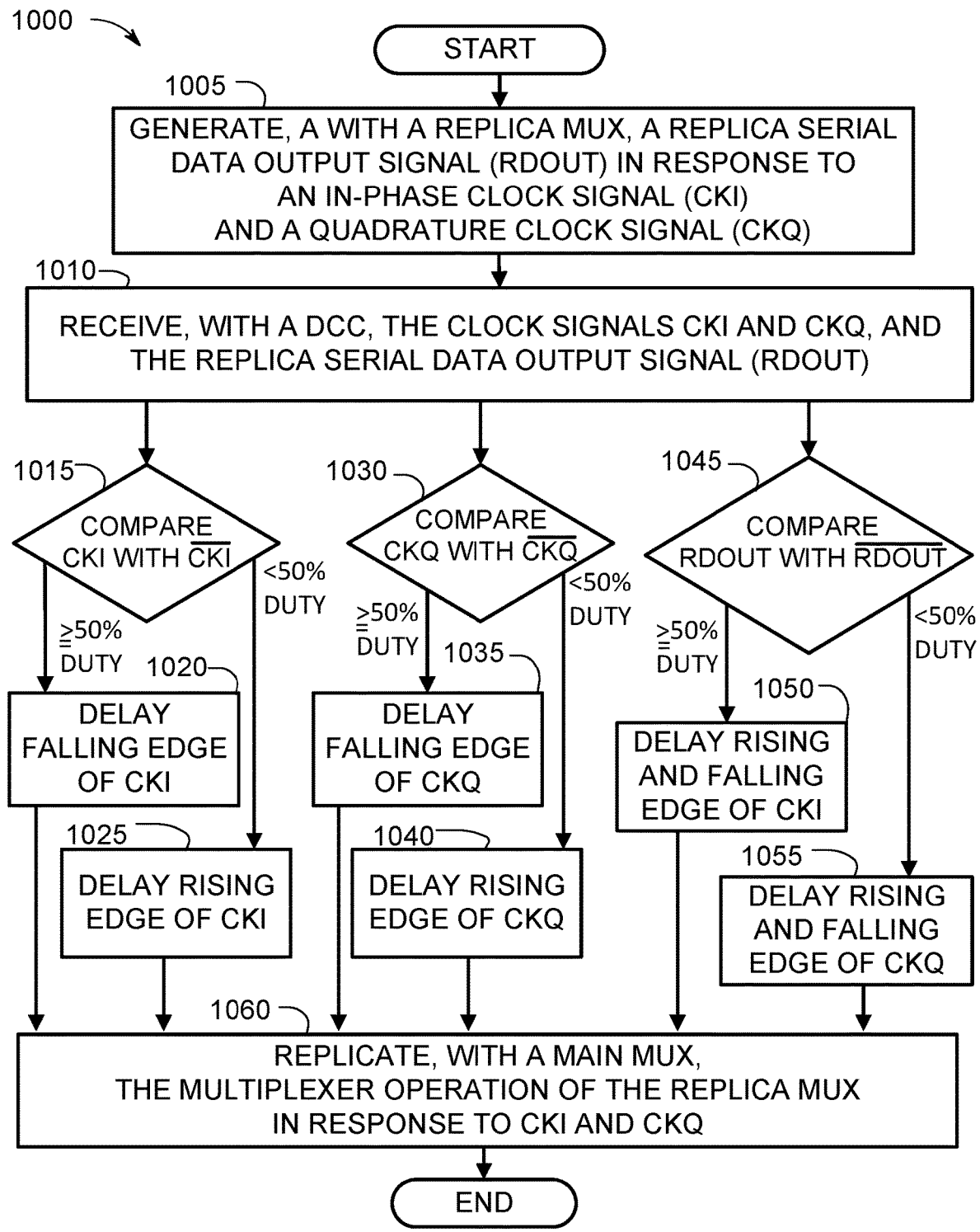
FIG. 10 depicts a flowchart of an exemplary clock phase alignment method.

FIG. 10 depicts a flowchart of an exemplary clock phase alignment method. An exemplary clock phase alignment method 1000 includes block 1005. In block 1005, the clock phase alignment method 1000 generates, with a replica multiplexer (RMUX), a replica serial data output signal (RDOUT) in response to an in-phase clock signal (CKI) and a quadrature clock signal (CKQ). Execution then continues from block 1005, to block 1010. In block 1010, the clock phase alignment method 1000 receives, with a DCC, the clock signals CKI and CKQ. The DCC may also receive the replica serial data output signal (RDOUT). Next, the method 1000 executes one of three decision blocks 1015, 1030 or 1045. The method 1000 may be performed iteratively, and may execute each of the three decision blocks in a queue. In various examples, the method 1000 may execute each of the three decision blocks sequentially and periodically.

The method 1000 may execute decision block 1015. In decision block 1015, the method compares CKI with an inverted CKI. If the result is a signal with greater than or equal to 50% duty, then an adjustable delay line delays a falling edge of CKI at block 1020. If the result is a signal with less than 50% duty, then the adjustable delay line delays a rising edge of CKI at block 1025. Execution then continues to block 1060.

The method 1000 may execute decision block 1030. In decision block 1030, the method compares CKQ with an inverted CKQ. If the result is a signal with greater than or equal to 50% duty, then an adjustable delay line delays a falling edge of CKQ at block 1035. If the result is a signal with less than 50% duty, then the adjustable delay line delays a rising edge of CKQ at block 1040. Execution then continues to block 1060.

The method 1000 may execute decision block 1045. In decision block 1030, the method compares RDOUT with an inverted RDOUT. If the result is a signal with greater than or equal to 50% duty, then an adjustable delay line delays a rising and falling edge of CKI at block 1050. If the result is a signal with less than 50% duty, then the adjustable delay line delays a rising and falling edge of CKQ at block 1055. Execution then continues to block 1060.

At block 1060, the method 1000 replicates, with a main multiplexer (MMUX), the multiplexor operation of the replica multiplexer in response to CKI and CKQ. Execution of the method 1000 may then be complete.

The exemplary clock phase alignment method 1000 may be executed by the calibration processing module 510, with reference to FIG. 5. The calibration processing module 510 may be implemented in hardware or software or a combination thereof.

Although various embodiments have been described with reference to the figures, other embodiments are possible. For example, various embodiments may not be limited to 4 inputs into 1 output. Accordingly, the multiplexer may input 8, 16, 32, 64 or 128 or more bits and generate 1 output. Various embodiments may employ one or more 4-to-1 multiplexers connected in various configurations to implement wider input buses.

Various embodiments may generate a delay control signal by employment of a digital signal processor (DSP). For example, various differential signal pairs may be individually low-pass filtered, the analog results read by the DSP. The DSP may compare the analog results by executing preprogrammed instructions fetched from a memory device. The DSP may provide an analog output signal to a compatible (analog input) delay line to further make adjustments to the duty cycle and/or phase of a set of clocks. In some implementations, the DSP may provide one or more digital output buses to a compatible (digital input) delay line. In various implementations, the DSP may provide the low-pass filtering. Further, in some examples, the DSP may provide the delay line functions.

In various examples, clock timing skew may be reflected on both the MMUX and RMUX as output jitter. The proposed clock calibration techniques may tune/calibrate the $CK_{0,180}$ phase to minimize output jitter. The tuning resolution may be determined by the minimum tunable range of the delay lines. Accordingly, the tuning loop may produce a calibrated clock timing within the resolution of the delay lines.

Various examples of modules may be implemented using circuitry, including various electronic hardware. By way of example and not limitation, the hardware may include transistors, resistors, capacitors, switches, integrated circuits and/or other modules. In various examples, the modules may include analog and/or digital logic, discrete components, traces and/or memory circuits fabricated on a silicon substrate including various integrated circuits (e.g., FPGAs, ASICs). In some embodiments, the module(s) may involve execution of preprogrammed instructions and/or software executed by a processor. For example, various modules may involve both hardware and software.

In an exemplary aspect, a multiplexer-clock calibration module may be adapted to track and compensate a multiplexer-clock input over dynamic operating conditions. The multiplexer-clock calibration module may include a main multiplexer module (MMUX) configured to receive a first array of data signals and may be operative to generate a main serial data output signal (MDout) by selecting one of the data signals in the first array in response to a multiphase MMUX control input. The multiplexer-clock calibration module may include a replica multiplexer module (RMUX) fabricated on a common substrate with the MMUX and configured to replicate the operation of the MMUX. The RMUX may be configured to receive a second array of data inputs and may be operative to generate a replica serial data output signal (RDout). The RMUX may be configured to generate RDout by selecting one of the data inputs in the second array in response to a multiphase RMUX control input. In various examples, the RMUX may be configured to emulate the operational characteristics of the MMUX over process, voltage, and temperature (PVT). RDout and MDout may each be formed as differential signals.

The multiplexer-clock calibration module may include a duty cycle calibration module (DCC) comprising three signal processing circuits. Each of the signal processing circuits may include at least one low pass filter (LPF) coupled to a differential error amplifier. The DCC may be configured to generate a first delay control signal and a second delay control signal to adjust a phase relationship between in-phase clock signals (CKI) and quadrature clock signals (CKQ) in response to RDout.

The multiplexer-clock calibration module may include an adjustable delay line module (ADLM) configured to generate the CKI and the CKQ signals. The ADLM may include a first adjustable delay line module, which may be adapted to delay a system in-phase clock signal (CK0,180) in response to the first delay control signal, to generate the CKI signals. The ADLM may include a second adjustable delay line module adapted to delay a system quadrature clock signal (CK90,270) in response to the second delay control signal, to generate the CKQ signals. The multiphase MMUX control input and the multiphase RMUX control input may be operatively connected to the ADLM to receive both the CKI and CKQ clock signals.

The DCC may be configured to dynamically modulate only the first delay control signal during a first portion of a time interval. The DCC may be configured to dynamically modulate only the second delay control signal during a second portion of the time interval. The DCC may be configured to dynamically modulate the first delay control signal and the second delay control signal during a third portion of the time interval. The first, second and third portions may be non-overlapping.

In some embodiments, each of the first and second adjustable delay line modules may include a voltage-controlled delay line. In various examples, the DCC may be configured to inject an offset voltage into at least one of the first delay control signal and the second delay control signal to adjust at least one of the voltage-controlled delay lines in response to a variance of the duty cycle of RDout with respect to a 50% duty cycle.

The DCC may be configured to repeat the dynamic modulation over a plurality of time intervals. The first adjustable delay line module may include a delay line, which may be adapted to modulate the duty cycle of CKI in response to the first delay control signal, and the second adjustable delay line module may include a delay line, which may be adapted to modulate the duty cycle of CKQ in response to the second delay control signal.

In some implementations, the first and second adjustable delay line modules may be configured to modulate the phase relationship between CKI and CKQ by modulating a timing between a rising edge or a falling edge of CKI relative to a rising edge or a falling edge of CKQ. The duty cycles of CKI and CKQ may be maintained substantially the same while modulating the timing between the rising edge or the falling edge of CKI relative to the rising edge or the falling edge of CKQ. The data inputs in the second array may be configured to form RDout as a substantially 50% duty cycle square wave clock signal at a frequency that is double a frequency of either one of CKI and CKQ.

FIGS. 11-18 as described below provides a method of calibrating a main circuit using a replica circuit, wherein the main circuit is used for performing the predetermined function of the main circuit (e.g. convert parallel data into serial data) and the replica circuit is formed for the purpose of replicating the specific functions and timing (e.g., clock delays, signal delays, rise times, fall times) of the main circuit, and therefore performs a replica function of the main circuit. The circuits and methods as set forth in FIGS. 11-18 below could be implanted in any circuit arrangement having a main circuit and a replica circuit, including main and replica serializer circuits that may be implemented in a MUX. Calibration schemes are generally used in integrated circuits to measure electrical characteristics, such as offset voltage, timing mismatch and impedance. Once those characteristics are measured, a corresponding correction/adaptation scheme can be used to tune the performance of those circuits to a desired state. While calibration may be best when performed on the actual circuit that is being calibrated, it is possible to utilize a replica circuit. As will be described in more detail below, a replica circuit is a copy of the actual circuitry to provide the same function and timing, which may or may not be scaled, to mimic the actual circuit behavior. A replica circuit may be necessary because of constraints from input pattern, loading or placement, for example. That is, any attempt to use the main circuit to obtain information that may be used in a calibration of the main circuit may interrupt or otherwise adversely affect the operation of the main circuit. While a serializer circuit implemented in a MUX is provided by way of example, it should be understood that the circuits and methods could apply to any function implemented in a circuit.

The circuits and methods set forth below describe an energy efficient method to calibrate a circuit, including for example, In-phase (I) and Quadrature (Q) clock signals, collectively IQ clock signals or IQ. According to implementations, IQ mismatch of a transmitter (TX) that employs low power 4-to-1 multiplexer (MUX) is described. As described above, a 4-to-1 mux is used instead of a 2-to-1 MUX as the final serializing stage for the TX because it eliminates the need of a 2T clock (where T is bit period), which is less power efficient in a given technology compared to 4T clock which is needed for a 4-to-1 MUX. As shown in the timing diagram in FIG. 2, a low power 4-to-1 MUX serializes 4T parallel data into 1 T bitstream using 4 phases of 4T clock, namely phase 0, 90, 180 and 270 without the need of 1 T pulse generation.

In addition to the clock skew between phases, there is also delay mismatch between the I path of the MUX (clocked using phase 0, 180 of the clock signal) and Q path of the MUX (which is clocked using the phase 90, 270 of the clock signal), as seen in this low power 4-to-1 MUX schematic depicted in FIG. 2. If the IQ mismatch is not calibrated out, it will manifest as TX output deterministic jitter (DJ). The deterministic jitter may degrade the link performance, especially for high speed transceiver operating at 112 Gb/s for example. However, IQ mismatch information can be obtained by sending a fixed pattern (such as a 1010 pattern) to the 4 inputs of 4-to-1 MUX. By observing the pulse width of the output serialized 1010 pattern, IQ mismatch is derived. Since it is not beneficial to constrain the input pattern of a link nor it is feasible to stop real time traffic of a main circuit for calibration, a replica 4-to-1 MUX is used for IQ calibration when such 4-to-1 MUX is employed as a main circuit. Because a replica path mimics the electrical characteristic of the actual path, it limits the minimum size of the MUX. That is, because a smaller size translates to higher IQ mismatch, a larger replica MUX may be used to minimize mismatch.

However, if the MUX is sized such that the mismatch between actual and replica circuits is within allocated TX DJ budget, high clocking power may be required, negating the original low power design intent. To overcome any limitation in the sizing of a replica circuit with respect to a main circuit, the circuits and methods set forth in FIGS. 11-18 implement a calibration scheme that is divided into two phases. First, foreground calibration is performed on the main circuit to measure the actual IQ mismatch. Since calibration is done in the foreground (i.e. during an operation before the main circuit is used for its intended function, such as providing serialized data by a serializer), there is no limitation for the input pattern to the 4-to-1 MUX. A smaller replica 4-to-1 MUX with fixed input pattern may also be used for background calibration to track changes in operating conditions, such as drift in the voltage and temperature (VT) during actual operation of the circuit, which may be referred to as mission mode operation. Since voltage and temperature affect the electrical characteristics of transistors of the circuit, such as mobility and threshold voltage in a deterministic fashion, even a small replica MUX should provide a first order VT drift tracking. That is, even if the small replica MUX exhibits a large random mismatch, any sizing limitation of the replica 4-to-1 MUX to minimize IQ mismatch is eliminated by combining the 2 phases of calibration, enabling lower clocking power that results from the use of the 4-to-1 MUX. The circuits and methods set forth below separate a continuous calibration with a replica circuit into a foreground calibration with the actual circuit and a background calibration with the replica circuit. By doing so low power operation can be achieved, where a replica circuit does not need to be larger than the main circuit, and may be smaller than the main circuit (e.g. smaller transistors for example).

Figure 11:
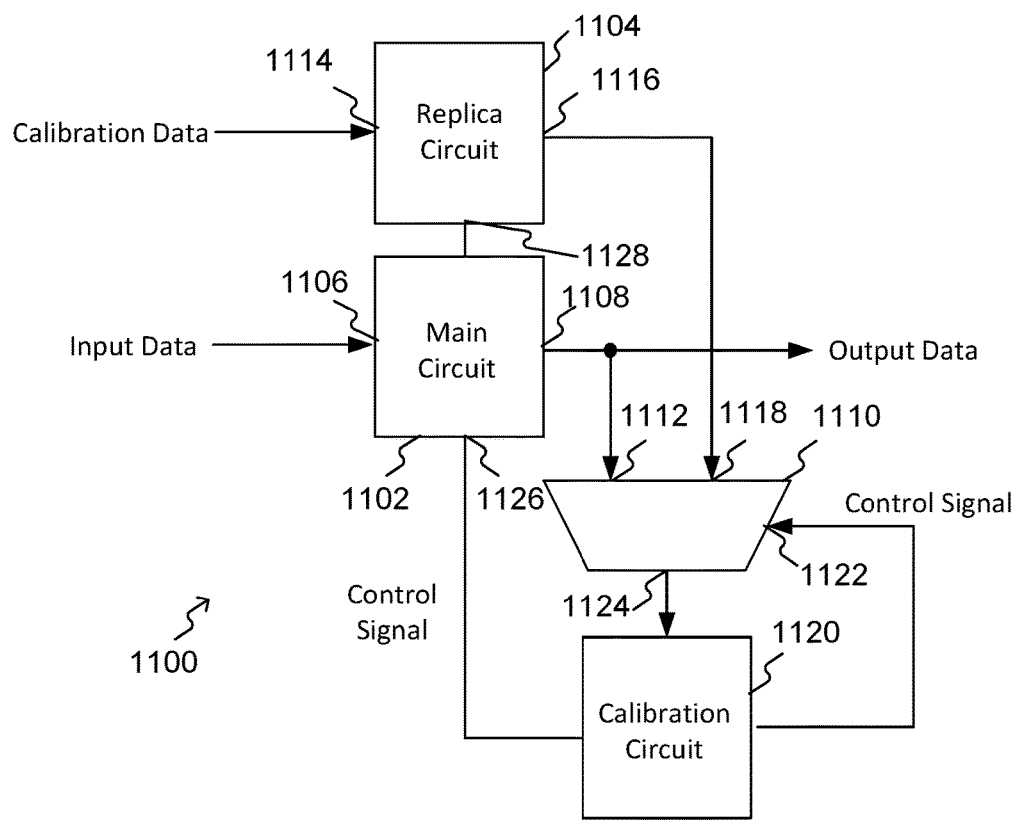
FIG. 11 depicts a block diagram of a circuit arrangement for calibrating a main circuit using a replica circuit.

FIG. 11 depicts a block diagram of a circuit arrangement for calibrating a main circuit using a replica circuit. More particularly, a circuit arrangement 1100 comprises a main circuit 1102 and a replica circuit 1104, where the main circuit 1102 is configured to provide a function, and the replica circuit is also configured to provide the same function and is used for performing calibration of the main circuit 1102. The main circuit 1102 is configured to receive input data at an input 1106 and generate output data at an output 1108, where the output data is also provided to a selection circuit 1110, shown here by way of example as a multiplexer, at an input 1112. The selection circuit 1110 enables the selection of the output of the main circuit and the replica circuit during the foreground and background stages of calibration in response to a selection control signal, as will be described in more detail below. The replica circuit 1104 is configured to receive calibration data at an input 1114 and generate calibration output data at an output 1116, where the calibration output data is provided to the selection circuit 1110 at an input 1118. As will be described in more detail below, the calibration data provided to the input of the replica circuit may comprise a fixed data pattern for example. A calibration circuit 1120 is configured to provide a control signal to an input 1122 to generate the signals provided to the inputs 1112 and 1118 at an output 1124. The calibration circuit 1120 may generate correction codes as described in more detail below. A control signal, which may be based upon the correction codes for example, is then provided to the main circuit 1102, which may be based upon the correction codes for example. The control signal may control any aspect of the main circuit to change the operation or performance of the main circuit, including electrical characteristics, such as offset voltage, timing mismatch, impedance, phase of a signal, frequency of a signal, and duty cycle of a signal, for example.

According to one implementation, the calibration circuit 1120 may operate in a 2-stage operation. The calibration circuit 1120 may control the selection circuit 1110 during different phases to detect outputs of the main circuit and the replica circuit, and generate control signals provided to the main circuit and replica circuit during operation of the main circuit and without interruption to the input data stream of the main circuit. More particularly, foreground calibration (i.e. calibration performed before the main circuit operates to implement a normal function of the main circuit after an initial calibration operation to obtain an initial calibration code for the main circuit) is performed at a block 1202. During the foreground calibration of the main circuit, a control signal is provided to the selection circuit to enable foreground calibration of the main circuit. It should be noted that the calibration function may be dependent upon the function of the main circuit, and can be used to initially calibrate the main circuit to operate correctly by changing any adjustable parameter to change the operation or performance of the main circuit, such as a adjusting a voltage, frequency, phase, duty cycle, or offset of a clock signal for example. An initial value of the parameter being calculated is determined for the parameter, where the initial value may be adjusted during normal operation of the main circuit (i.e. during the background calibration phase and based upon a correction code for example).

A foreground calibration of the replica path is then performed on the replica circuit at a block 1204 to determine an initial value of a parameter for the replica circuit. That is, the control signal generated by the calibration circuit enables the selection of the output of the replica circuit to be received by the calibration circuit during the foreground calibration of the replica circuit. An initial value of a parameter associated with a replica circuit can be determined, which may be an initial correction code for example. Variations in the value of the parameter from the initial value for the replica circuit can then be monitored, where the variations in the parameter for the replica circuit are used to determine changes in the operational environment, such as changes in voltages or changes in temperatures for example. More particularly, background calibration is performed on the replica circuit to determine changes in the operating environment during a block 1206.

A correction of the main circuit can then be performed based upon the detected changes in parameters associated the replica circuit. That is, a variation in a parameter associated with the replica circuit detected during a background calibration is used to adjust the parameter of the main circuit at a step 1208. For example, the parameter of the main circuit is adjusted based upon the detected change in the same parameter of the replica circuit. According to one implementation, a parameter associated with a clock signal, such as a phase of a clock signal used for a transmitter circuit (e.g. a serializer circuit for receiving parallel data and generating serial data), may be adjusted during a background calibration of the transmitter circuit based upon changes detected during background calibration of the replica circuit. For example, corrected clock signals as described above could be generated by the calibration circuit and provided to the main circuit. Additional examples of the foreground and background calibration are described below in reference to FIG. 19.

Figure 13:
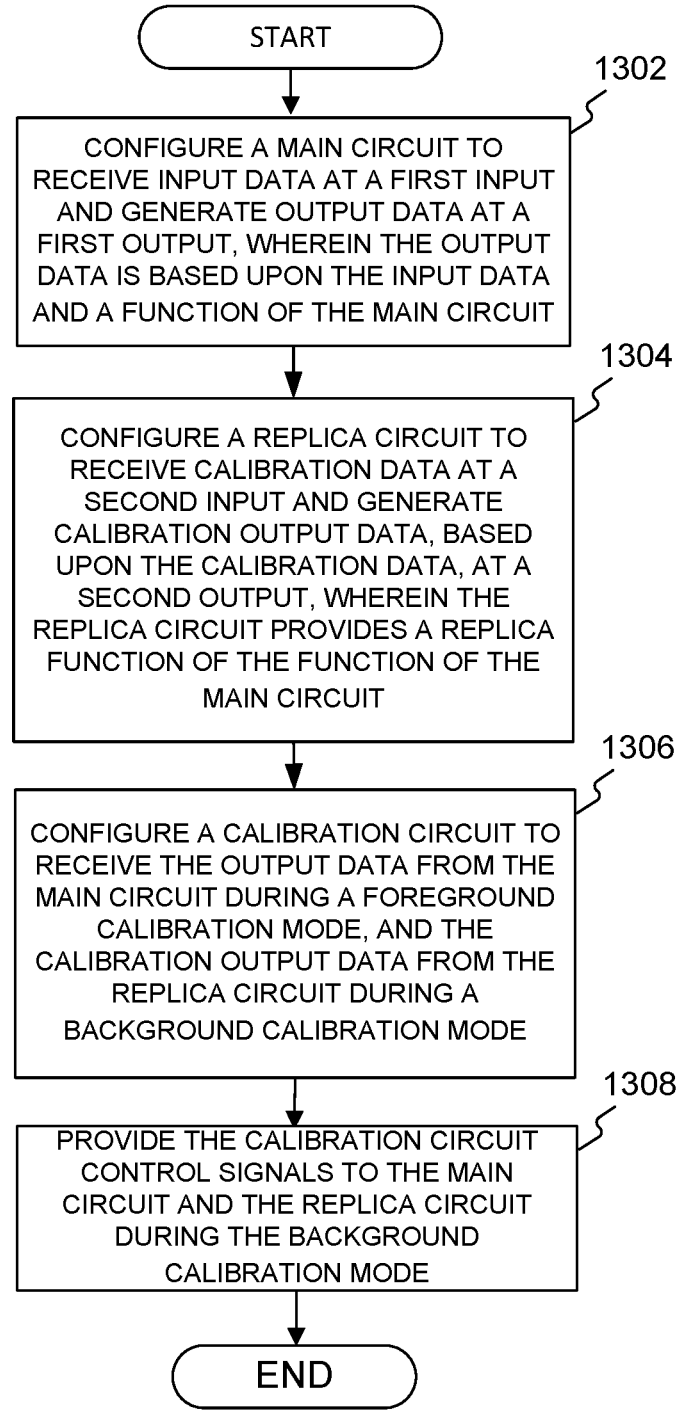
FIG. 13 depicts another flow chart showing a method of calibrating a circuit for receiving input data and generating output data.

FIG. 13 depicts another flow chart showing a method of calibrating a circuit for receiving input data and generating output data. A main circuit is configured to receive input data at a first input and generate output data at a first output, wherein the output data is based upon the input data and a function of the main circuit at a block 1302. A replica circuit is configured to receive calibration data at a second input and generate calibration output data, based upon the calibration data, at a second output, wherein the replica circuit provides a replica function of the function of the main circuit at a block 1304. A calibration circuit is configured to receive the output data from the main circuit during a foreground calibration mode, and the calibration output data from the replica circuit during a background calibration mode at a block 1306. The calibration circuit provides control signals to the main circuit and the replica circuit during the background calibration mode at a block 1308 to enable a correction of the main circuit.

The method may further comprise configuring a selection circuit to receive the output data from the main circuit and the calibration output data from the replica circuit, wherein the selection circuit controls the selection of the output data and the calibration output data during the foreground calibration mode. The main circuit may comprise a first serializer circuit configured to receive parallel input data and generate serial output data, wherein the first serializer circuit generates the serial output data during an operating mode. The replica circuit may comprise a second serializer circuit configured to receive a parallel test pattern and generate the calibration output data during the operating mode. The background calibration may be run continuously or periodically during the operating mode. The method may also comprise configuring the calibration circuit to receive a plurality of clock phases of an input clock signal, and coupling corrected clock signals generated by the calibration circuit to a first control terminal of the main circuit and a second control terminal of the replica circuit.

The calibration circuit may also be configured to receive the output of the replica circuit during the foreground calibration mode to determine an initial replica calibration code, and configured to receive the output of the replica circuit during the background calibration mode to determine an updated replica calibration code. The method may further comprise determining a difference in the initial replica calibration code and the updated replica calibration code. Corrected control signals, based upon the initial calibration code for the main circuit and the difference in the initial replica calibration code and the updated replica calibration code, may then be provided to the main circuit and the replica circuit, where the corrected control signals comprise corrected clock signals.

Figure 12:
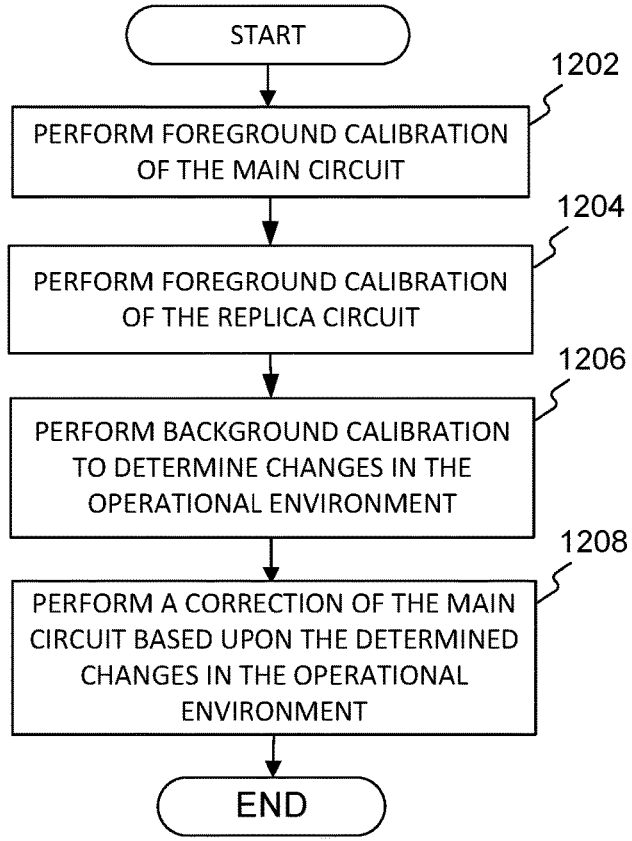
FIG. 12 depicts a flow chart showing a method of calibrating a circuit for receiving input data and generating output data.

The circuits and methods set forth in FIGS. 11-13 can be extended to any calibration scheme that requires a replica path due to an input pattern constraint, such as the inability to pause the input of data to a main circuit to perform calibration. Also, by using foreground calibration and then using a replica path to track any systematic variation due to change in operation environment, any mismatch issues can be avoided. The circuits and methods can be used in any type of circuit where the change in environment (e.g. voltage and temperature) results in a deterministic and uni-directional change in the paths of both the actual and replica circuits.

Figure 14:
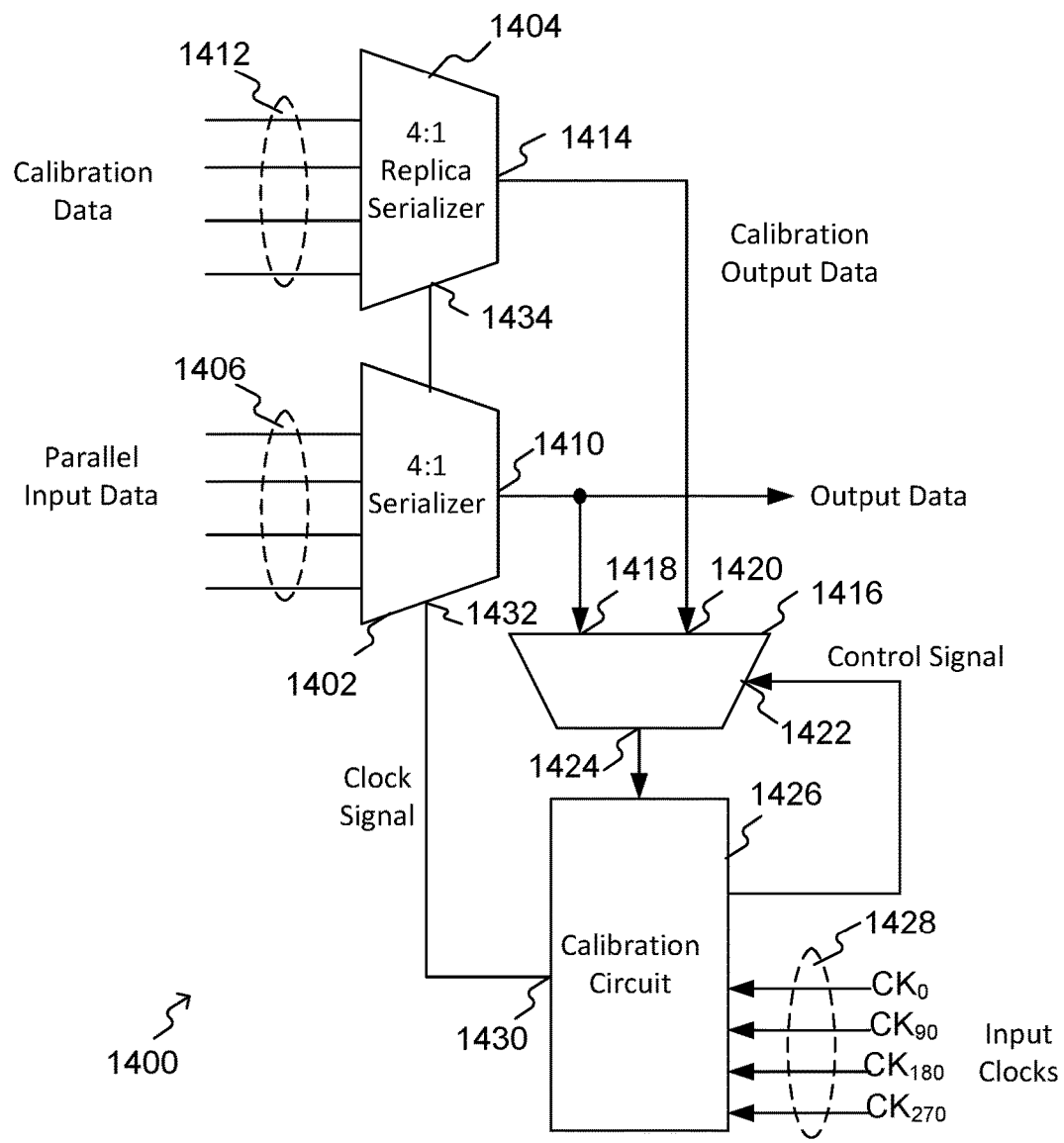
FIG. 14 depicts another block diagram of a circuit for calibrating a serializer receiving parallel data and generating serial data.

FIG. 14 depicts another block diagram of a circuit arrangement 1400 for calibrating a serializer circuit receiving parallel data and generating serial data. A main serializer circuit 1402 and a replica serializer circuit 1404, shown here by way of example as a 4:1 serializer circuits, are configured to receive parallel data and generate serial data. More particularly, the main serializer circuit 1402 is configured to receive parallel input data at an input 1406 and generate serial data at an output 1410. The main serializer circuit 1402 is used for receiving parallel input data during normal operation of the serializer circuit (i.e. operation of the serializer circuit after foreground calibration is performed). The replica serializer circuit 1404 is configured to receive calibration data at inputs 1412 and generate serialized data at an output 1414.

A selection circuit 1416, shown by way of example as a multiplexer, is configured to receive an output of the main serializer circuit 1402 at an input 1418 and an output of the replica serializer at an input 1420. A selection control signal provided to a control input 1422 generates a selected one of the signal coupled to the input 1418 or the signal coupled to the input 1420 at an output 1424. A calibration circuit 1426 is coupled to receive the selected signal generated at the output of the selection circuit 1416, where the calibration circuit 1426 generates the selection control signal provided to the control input of the selection circuit 1416. The calibration circuit also receives input clock signals, shown here by way of example as the four in-phase and quadrature (I and Q) phases 1428 of a clock signal designated as CLK0, CLK90, CLK180 and CLK270. The calibration circuit 1426 generates an output clock signal (e.g. corrected clock signals) that may have different electrical characteristics, such as offset voltage, timing mismatch, frequency, phase or impedance for example, at an output 1430 and provided to the selection inputs 1432 and 1434. The calibration circuit 1426 may generate correction codes as described in more detail below. The output clock signal may be a delayed clock signal for example. The output clock signals generated by the calibration circuit may be generated as described above in reference to FIGS. 3-10.

Therefore, the circuit arrangement of FIG. 14 having a 4-to-1 MUX may be used in the final serializing stage of a transmitter that is clocked by 4 phases (0, 90, 180, 270) of 4T clock, where T is the bit period. Using only 4T clocks for 4-to-1 serialization provides substantial power saving in terms of clock generation and propagation since it eliminates the need for higher frequency clock. However, as described above, there is an inherent IQ mismatch in this topology that needs to be calibrated out. Because a fixed input pattern may be beneficial to calibrate a 4-to-1 MUX, a replica path may be used so calibration can be continuously run all the time to track voltage and temperature drift for example.

Figure 15:
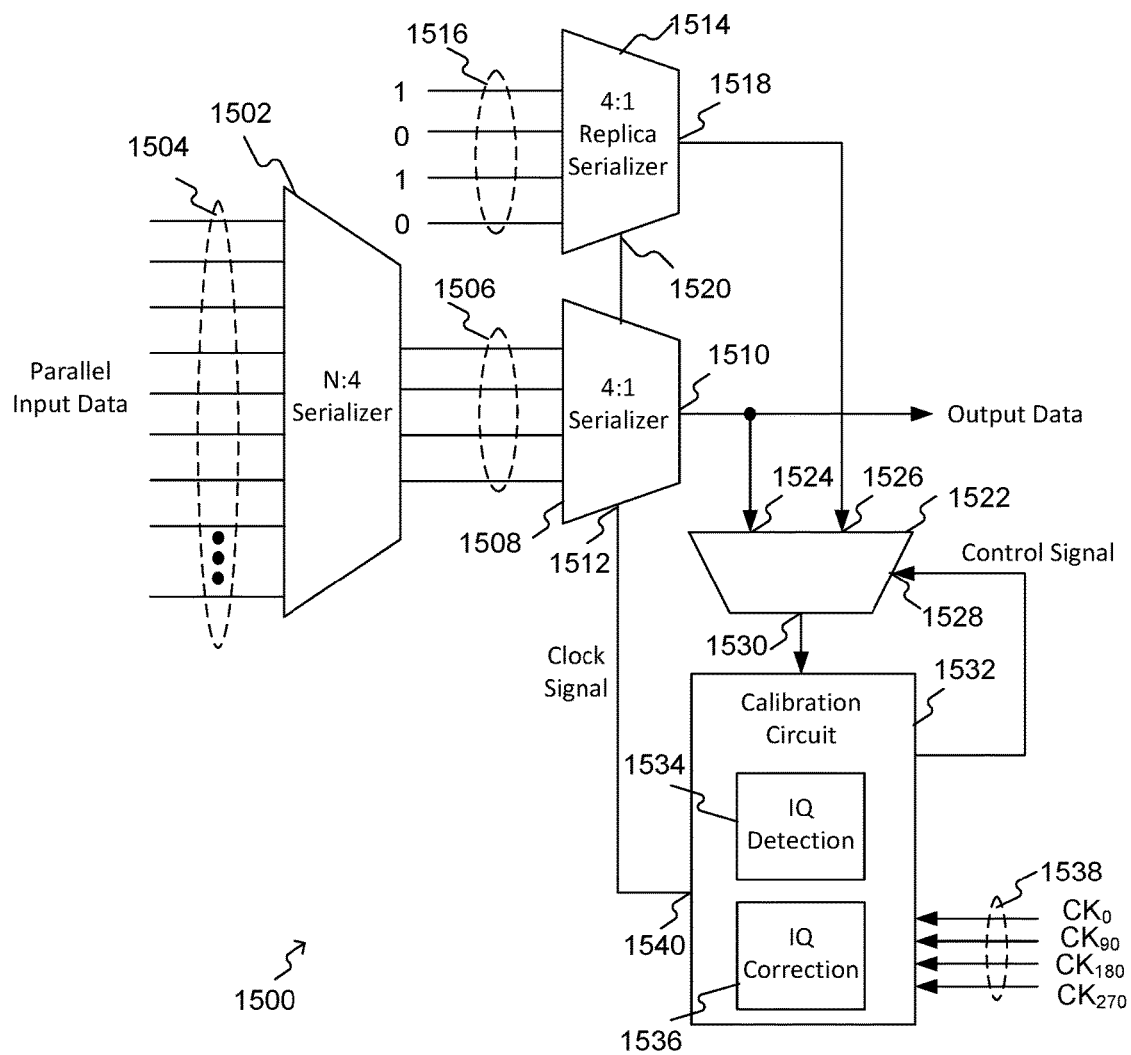
FIG. 15 depicts another block diagram of a circuit for calibrating a serializer receiving parallel data and generating serial data.

FIG. 15 depicts another block diagram of a circuit arrangement 1500 for calibrating a serializer circuit receiving parallel data and generating serial data. The implementation of FIG. 15 is similar to the implementation of FIG. 14, but includes a first level serializer circuit 1502 shown by way of example as a N:4 serializer configured to receive parallel input data at a plurality of inputs 1504 and generate outputs at outputs 1506. Outputs 1506 of the first level serializer 1502 are provided to inputs of a serializer circuit 1508, shown here by way of example as a 4:1 serializer circuit, where serialized output data is generated at an output 1510 in response to a clock signal provided to a control input 1512 of the serializer circuit 1508.

The replica serializer circuit 1514 is configured to receive inputs signals at an input 1516, shown by way of example as a fixed input pattern "1010", an output of which is generated at an output 1518 in response to the clock signal provided to the control terminal 1520. The output 1510 of the serializer circuit 1508 and the output 1518 of the replica serializer 1514 are coupled to a selection circuit 1522, shown here by way of example as a multiplexer, at inputs 1524 and 1526. A selection control signal provided to a control terminal 1528 enables the selection of one of the signals provided to the inputs 1524 and 1526 to be generated at the output 1530 and coupled to a calibration circuit 1532.

Figure 16:
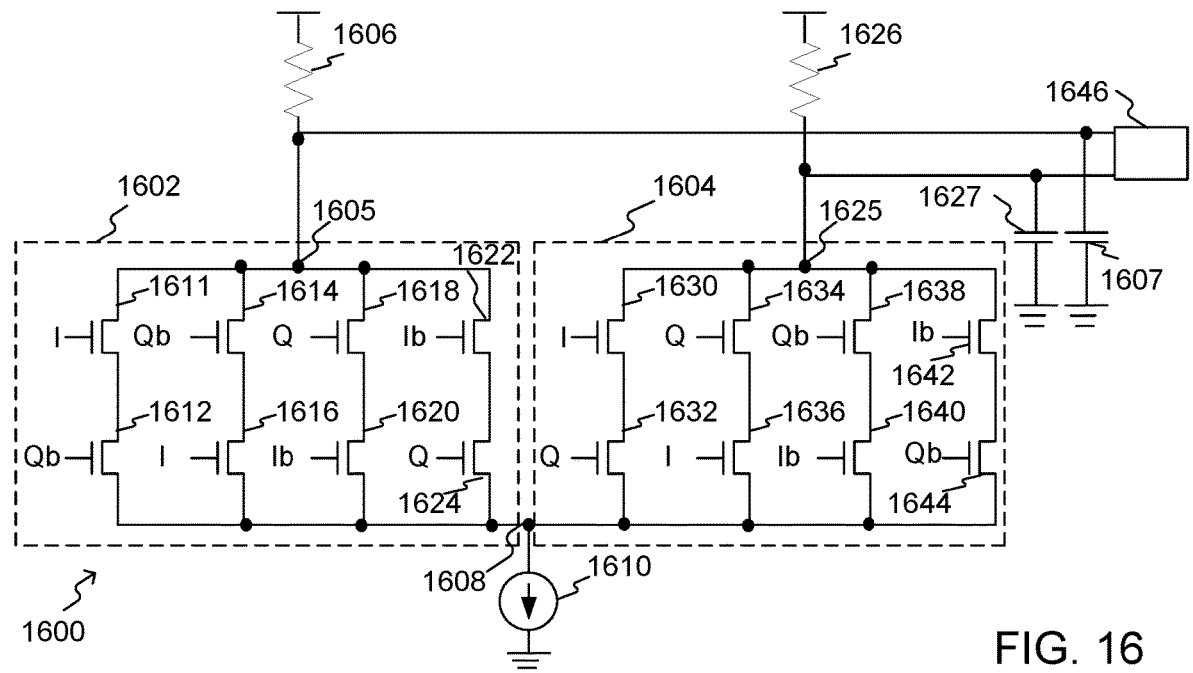
FIG. 16 depicts an exemplary block diagram of a circuit that could provide IQ detection.
Figure 17:
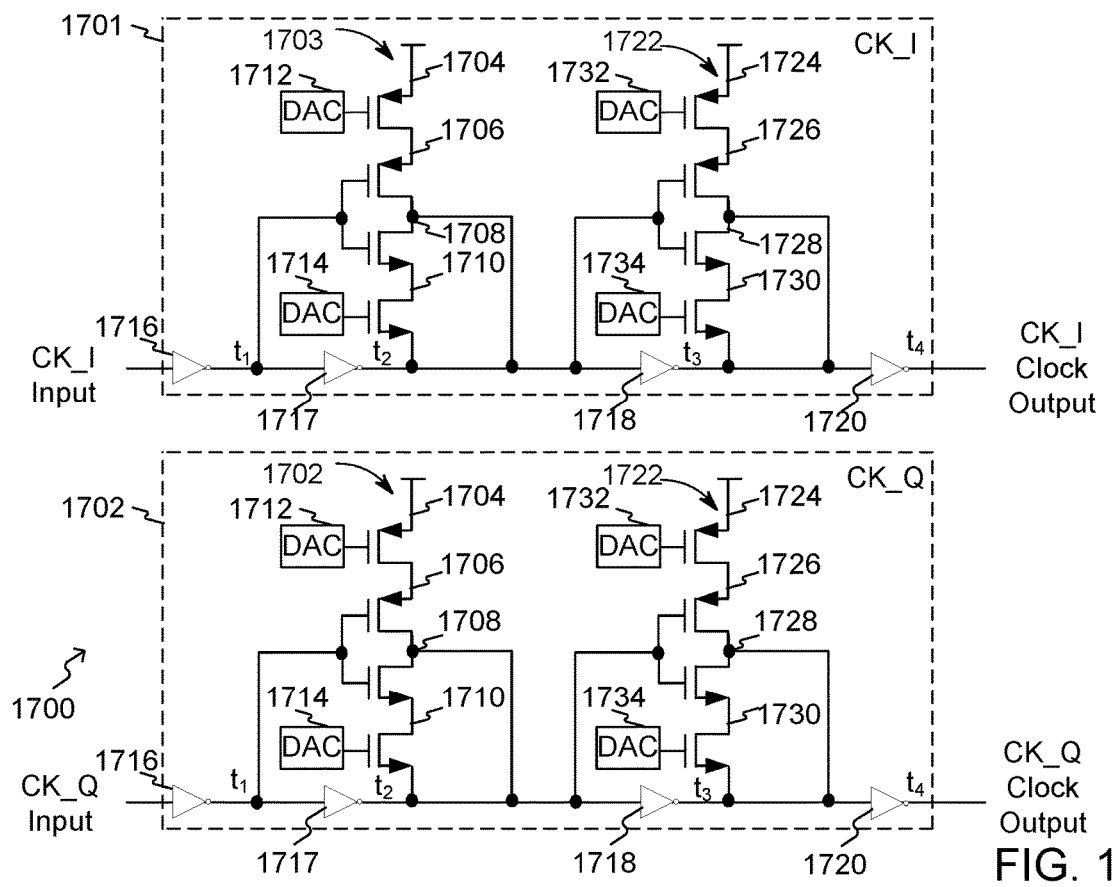
FIG. 17 depicts an exemplary block diagram of a circuit that could provide IQ correction.

The calibration circuit 1532 comprises an IQ detection circuit 1534 and an IQ correction circuit 1536. An example of the IQ detection circuit 1534 is shown in FIG. 16 and an example of the IQ correction 1536 is shown in FIG. 17. While the circuits of FIGS. 16 and 17 are shown by way of example, it should be understood that other IQ detection and IQ correction circuits could be implemented. The calibration circuit 1532 is adapted to receive the input clocks 1538C ($K_0$, $CK_{90}$, $CK_{180}$, $CK_{270}$), and generate at an output 1540 corrected clock signals coupled to the control terminals 1512 and 1520 to select the inputs to main serializer circuit 1508 and the replica serializer circuit 1514 that are coupled to the selection circuit 1522. That is, as a part of the calibration process, the corrected clock signals are provided to at least the main circuit to enable the operation of the main circuit based upon detected IQ mismatch and corrected IQ mismatch using the calibration circuit 1532. The IQ detection circuit 1534 and the IQ correction circuit 1536 could be implemented in the DDC circuit 500 of FIG. 5 to generate the in-phase-to-quadrature alignment.

FIG. 16 depicts an exemplary block diagram of a circuit that could provide IQ mismatch detection for detecting mismatch in the in-phase and quadrature phases of a clock signal (I ($CK_0$), Q ($CK_{90}$), Ib ($CK_{180}$), Qb ($CK_{270}$). The IQ detection circuit 1600 comprises a first detection block 1602 and a second detection block 1604. The first detection block 1602 comprises an output node 1605 coupled to a first terminal of a resistor 1606 (having a second terminal coupled to a power reference node) and coupled to a first terminal of a capacitor 1607 having a second terminal coupled to a ground node. The first detection block also comprises a plurality of signal paths between the node 1605 and a node 1608 coupled to a current source 1610 providing a current path to ground. The plurality of signal paths comprises a first signal path having a first transistor 1611 having a gate coupled to receive the I clock signal coupled in series with a second transistor 1612 having a gate coupled to receive the Qb clock signal. A second signal path comprises a first transistor 1614 having a gate coupled to receive the Qb clock signal coupled in series with a second transistor 1616 having a gate coupled to receive the I clock signal. A third signal path comprises a first transistor 1618 having a gate coupled to receive the Q clock signal coupled in series with a second transistor 1620 having a gate coupled to receive the Ib clock signal. A fourth signal path comprises a first transistor 1622 having a gate coupled to receive the Ib clock signal coupled in series with a second transistor 1624 having a gate coupled to receive the Qb clock signal.

The second detection block 1604 comprises an output node 1625 coupled to a first terminal of a resistor 1626 (having a second terminal coupled to a power reference node) and coupled to a first terminal of a capacitor 1627 having a second terminal coupled to a ground node. The plurality of signal paths of the second detection block 1604 comprises a first signal path having a first transistor 1630 having a gate coupled to receive the I clock signal coupled in series with a second transistor 1632 having a gate coupled to receive the Q clock signal. A second signal path comprises a first transistor 1634 having a gate coupled to receive the Q clock signal coupled in series with a second transistor 1636 having a gate coupled to receive the I clock signal. A third signal path comprises a first transistor 1638 having a gate coupled to receive the QB clock signal coupled in series with a second transistor 1640 having a gate coupled to receive the Ib clock signal. A fourth signal path comprises a first transistor 1642 having a gate coupled to receive the Ib clock signal coupled in series with a second transistor 1644 having a gate coupled to receive the Qb clock signal. A detection circuit 1646 is coupled to nodes 1605 and 1625 to detect voltage differences in the nodes. If I and Q are fully balanced, the voltages are identical. If not, the I and Q clock signals are corrected. According to one implementation, the I and Q signals could be corrected using the IQ mismatch correction circuit of FIG. 17 for example.

FIG. 17 depicts an exemplary block diagram of a circuit 1700 that could provide IQ correction. The circuit 1700 comprises a first circuit 1701 adapted to correct the clock CK_I and a second circuit 1702 adapted to correct the clock CK_Q. The first circuit 1701 comprises a first series of transistors 1703 adapted to generate a delayed clock signal based upon the input clock signal. More particularly, a p-channel transistor 1704 is coupled between a reference voltage and a second p-channel transistor 1706. A n-channel transistor 1708 is also coupled in series with transistor 1706 as shows, and comprises a gate that is coupled to the gate of the transistor 1706. A n-channel transistor 1710 is coupled to the transistor 1708. The transistor 1704 comprises a gate configure to receive an output of a digital-to-analog converter (DAC) 1712 and the transistor 1710 is configured to receive an output of a DAC 1714. The circuit 1701 further comprises a series of inverters 1716-1720 for generating various delayed corrected output signals, where $t_1$ is generated at the output of the inverter 1716, $t_2$ is generated at the output of the inverter 1716, $t_3$ is generated at the output of the inverter 1716, and $t_4$ is generated at the output of the inverter 1716. The gates of the transistors 1706 and 1708 are coupled together at the output of the inverter 1716, while the drain of transistor 1706 and drain of transistor 1708 are coupled together at the output of the inverter 1717.

The first circuit 1701 comprises a second series of transistors 1722 adapted to generate a delayed clock signal based upon the input clock signal. More particularly, a p-channel transistor 1724 is coupled between a reference voltage and a second p-channel transistor 1726. A n-channel transistor 1728 is also coupled in series with transistor 1726 as shown, and comprises a gate that is coupled to the gate of the transistor 1726. A n-channel transistor 1730 is coupled to the transistor 1728. The transistor 1724 comprises a gate configure to receive an output of a digital-to-analog converter (DAC) 1732 and the transistor 1730 is configured to receive an output of a DAC 1734. The gates of the transistors 1726 and 1728 are coupled together at the output of the inverter 1717, while the drain of transistor 1726 and drain of transistor 1728 are coupled together at the output of the inverter 1717. The second circuit 1702 is configured in the same manner as the first circuit 1701, but is adapted to receive the clock signal CK_Q.

The inverters 1716-1720 introduce delays associated with clock edges of the inputs of the first circuit 1701 and the second circuit 1702 to eliminate IQ mismatch. The DACs 1712, 1714, 1732, and 1734 represent digital codes that are used to change the rising and falling edges of the clock edges. The digital codes may be adjusted in an iterative manner with the IQ Detection circuit of FIG. 16 to reduce or eliminate IQ mismatch.

Figure 18:
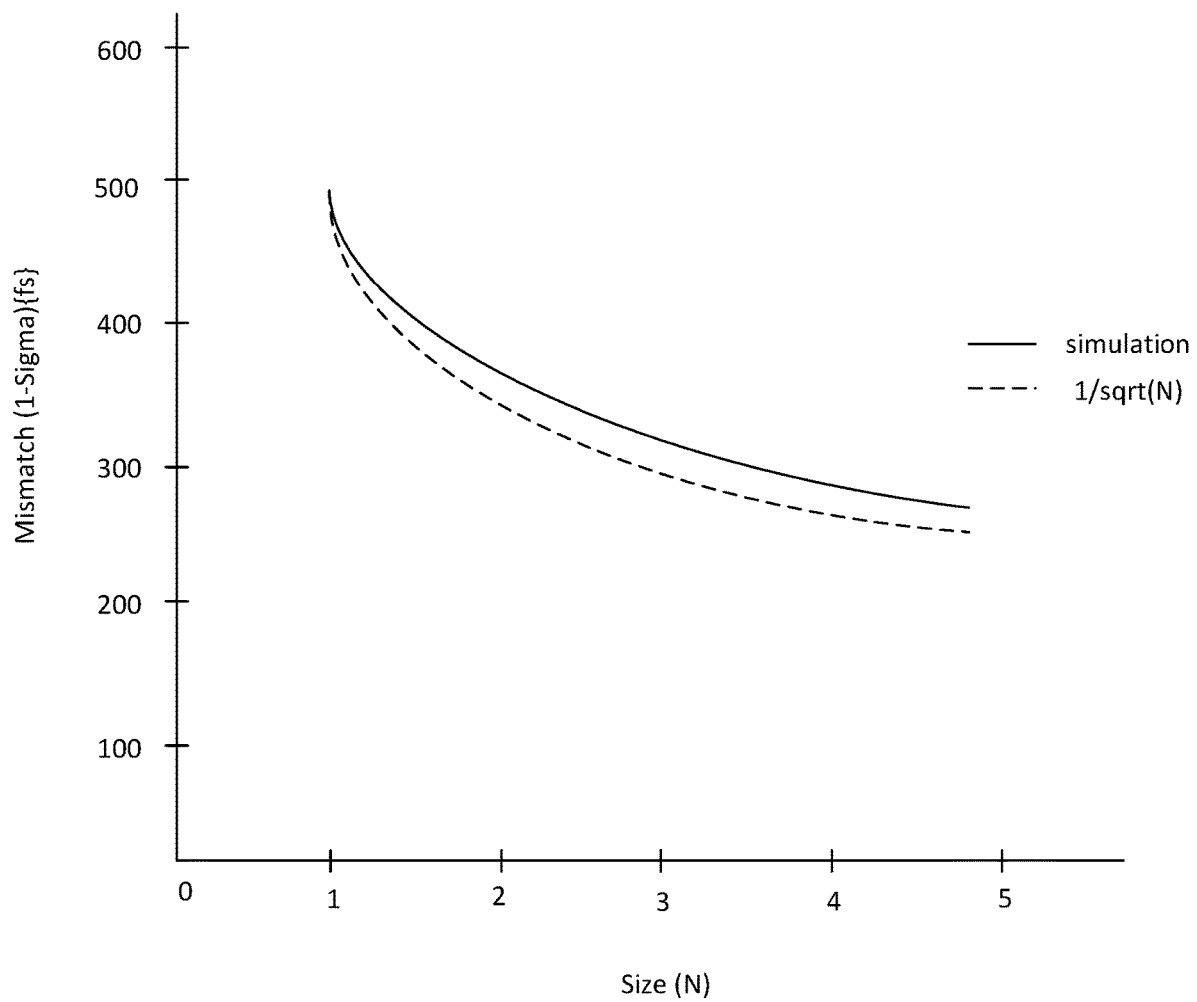
FIG. 18 depicts a graph showing mismatch as a function of size (N) for a simulation and 1/sqrt(N).

FIG. 18 depicts a graph showing mismatch as a function of size (N), where N is associated with a size of the replica circuit, for a simulation and 1/sqrt(N). As show in FIG. 18, timing mismatch is inversely proportional to 1/sqrt(area), making mismatch reduction by increasing sizes a power costly task. For example, to reduce timing mismatch by 2×, area must increase by 4×. The circuits and methods of using the 2-stage calibration process eliminates the requirement for a large replica circuit that is implemented for purposed of reducing timing mismatch. Further, a simulation result shown in table 1 indicates the benefits of using the 2-stage calibration process, such as reducing IQ mismatch based upon VT tracking. The simulation measures 4-to-1 MUX IQ error in the presence of random mismatch. With replica path VT tracking, mean IQ error reduces from ~300 fs to ~100 fs and sigma value is halved from ~130 fs to ~60 fs when compared to VT drift without replica path tracking.

TABLE 1

| Statistical IQ Error Due to VT Drift | | | |
| --- | --- | --- | --- |
| | | Mean (Sec) | Sigma |
| With Replica | Fast | 1.02E−13 | 6.12E−14 |
| | Slow | 1.05E−13 | 6.89E−14 |
| | Nominal | 9.96E−14 | 6.18E−14 |
| Without Replica | Fast | 2.95E−13 | 1.22E−13 |
| | Slow | 3.55E−13 | 1.37E−13 |
| | Nominal | 3.27E−13 | 1.32E−13 |

Figure 19:
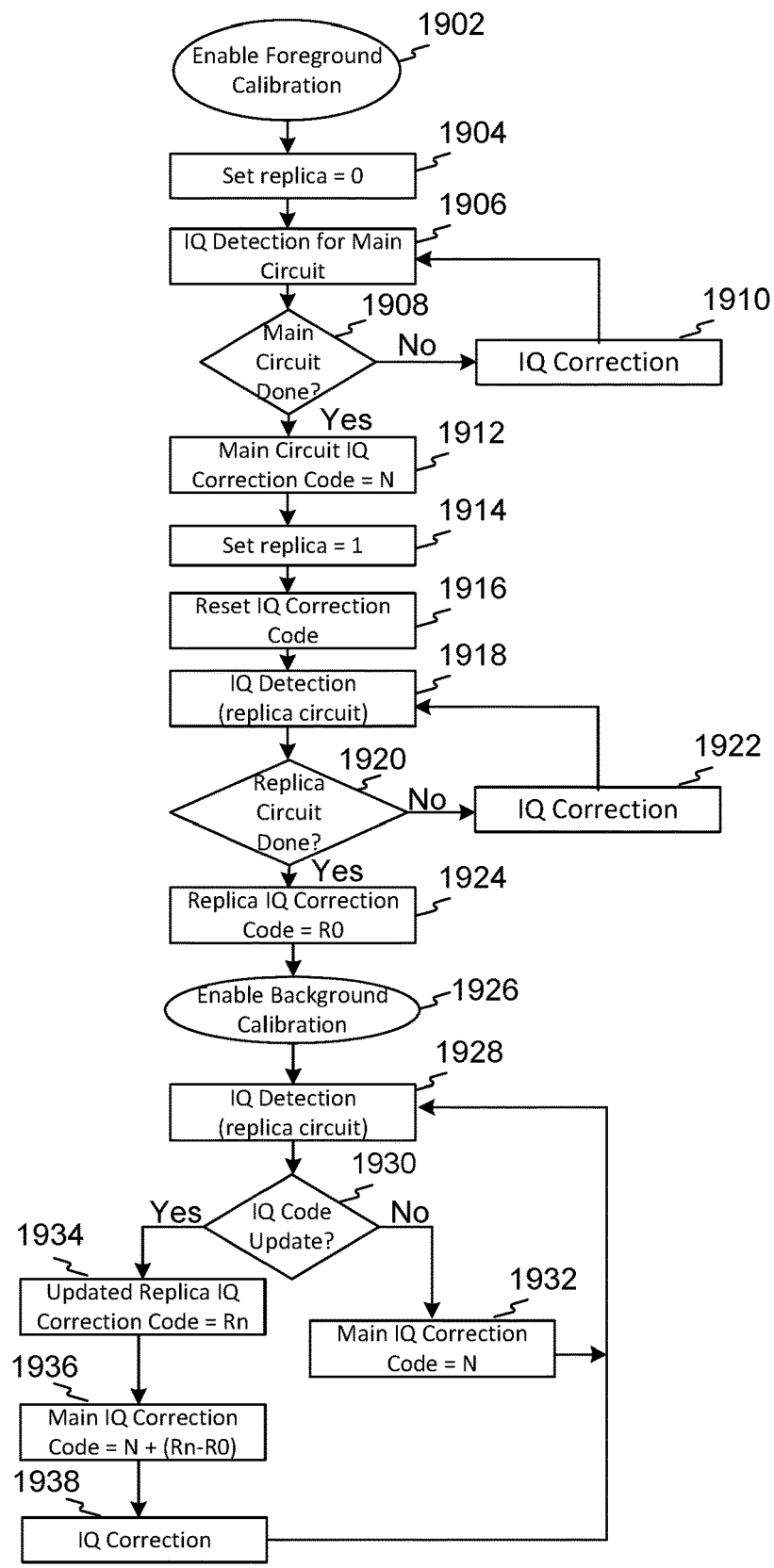
FIG. 19 depicts a flow chart showing a method of performing a calibration of a circuit.

FIG. 19 depicts a flow chart showing a method of performing a calibration of a circuit. According to the method of FIG. 19, a 2-step calibration process is performed, including a first calibration mode comprising foreground calibration mode and a second calibration mode comprising a background calibration mode. The foreground calibration mode is performed before a circuit that being calibrated is functioning in an operating mode. For example, an operating mode of a serializer circuit would be when the serializer circuit would be receiving parallel data that is converted to serial data. The background calibration mode is performed during the operating mode of the circuit being calibrated. The method of FIG. 19 could be implemented using the circuits of FIGS. 11, 14 and 15 as described above, or some other suitable circuits.

Foreground calibration is enabled at a block 1902. Foreground calibration could be enabled in response to a startup or a reset of a device having the circuit being calibrated or during a startup or reset of a circuit being calibrated, for example. A "replica" signal is set to 0 at a block 1904, indicating that the IQ detection is to be performed on data associated with a circuit being calibrated (i.e. the main circuit receiving the data and performing calibration on the data during foreground calibration). By way of example, the replica signal could be provided to a selection control terminal of a selection circuit configured to receive an output of a main circuit or a replica circuit, such as described above in reference to FIGS. 11, 14 and 15. IQ detection is then performed on the main circuit at a block 1906. For example, during IQ detection, variations in clock edges for the different phases of a clock signal can be detected as described above in reference to FIG. 16, after which IQ correction is performed, such as described above in reference to FIG. 17, in an iterative process, with IQ correction being performed at a block 1910. Therefore, it is then determined whether IQ correction for the main circuit is done at a block 1908. If variations in the clock edges of the different phases of the clock signal may need to be corrected, indicating that IQ correction for the path may still be needed, IQ correction will be performed at the block 1910. After IQ correction for correction of the main circuit is finished, an initial correction code for the main circuit, which may be an IQ correction code for example, is set equal to N at a block 1912. As will be described in more detail below, the initial correction code N represents a current correction code that may be adjusted or updated during an operating mode of the main circuit based upon changes in the replica circuit during background calibration.

The replica signal is then set to "1" at a block 1914 to perform IQ correction for the replica circuit by resetting the replica correction code, which may be a replica IQ correction code for example, at a block 1916 and performing IQ detection associated with the replica circuit at a block 1918. It is then determined whether IQ correction for the replica circuit is done at a block 1920. If not, IQ correction is performed at the block 1922, and IQ detection is then performed at the block 1918 in an iterative process until IQ mismatch has been corrected. After it is determined that IQ correction for the replica circuit is complete at the block 1920, a replica correction code, which may be a replica IQ correction code, is set to R0 at a block 1924, where R0 represents an initial replica correction code for the replica circuit. As will be described in more detail below, the initial replica correction code for the replica circuit can be used to determine a change in replica circuit, such as due to voltage or temperature changes, where a detected change in the replica circuit is used to update or correct a correction code for the main circuit.

More particularly, background calibration is enabled at a block 1926 after the replica correction code is determined at the block 1924. IQ detection is then performed on the replica circuit at a block 1928, and it is determined whether an IQ correction code for the main circuit should be updated at a block 1930. That is, if there is no change in the replica correction code based upon the IQ detection step 1928, the correction code for the main circuit is maintained at N at block 1932, and the process preforms IQ detection at the block 1928. However, if it is determined that an IQ code update is necessary at the block 1930, an updated replica correction code, which may be an updated IQ replica correction code, is set equal to Rn at block 1934. An updated correction code for the main circuit, which may be an updated IQ correction code, is then set to $N_{new}=N+(Rn-R0)$ at a block 1936, and IQ correction is performed at a block 1938. Therefore, the method of FIG. 19 approximates a change in an correction code of a main circuit based upon changes in the operation of the replica circuit during an operating mode of the main circuit that may be due to changes in voltage or temperature for example. Therefore, to circumvent the sizing constraint imposed by timing mismatch, a 2-phase calibration scheme may be implemented. Correction codes could be used to control and generate the control signals provided to the main and replica circuits, such as controlling the clock signals provided to the main and replica circuits, where the rising and falling edges may be adjusted using DAC values as described in FIG. 17 for example. While IQ correction codes and IQ correction are described by way of example in FIG. 19, it should be understood that the method of FIG. 19 could relate to any type of correction code provided to the main circuit and the replica circuit in response to the detection of a need for correction for any type of operation of a circuit.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A circuit arrangement for calibrating a circuit in an integrated circuit device, the circuit arrangement comprising:
    a main circuit configured to receive input data at a first input and generate output data at a first output, wherein the output data is based upon the input data and a function of the main circuit;
    a replica circuit configured to receive calibration data at a second input and generate calibration output data, based upon the calibration data, at a second output, wherein the replica circuit provides a replica function of the function of the main circuit; and
    a calibration circuit configured to receive the output data from the main circuit during a foreground calibration mode, and the calibration output data from the replica circuit during a background calibration mode, wherein the calibration circuit is coupled to the main circuit and to the replica circuit, wherein the calibration circuit is configured to provide control signals to the main circuit and the replica circuit during the background calibration mode.

2. The circuit arrangement of claim 1, further comprising a selection circuit configured to receive the output data from the main circuit and the calibration output data from the replica circuit, wherein the selection circuit controls a selection of the output data and the calibration output data during the foreground calibration mode.

3. The circuit arrangement of claim 1, wherein the main circuit comprises a first serializer circuit configured to receive parallel input data and generate serial output data, wherein the first serializer circuit generates the serial output data during an operating mode.

4. The circuit arrangement of claim 3, wherein the replica circuit comprises a second serializer circuit configured to receive a parallel test pattern and generate the calibration output data during the operating mode.

5. The circuit arrangement of claim 1 wherein the calibration circuit is configured to:
    generate a plurality of error signals based on a duty cycle of one or more differential pairs of input signals being equal to or greater than 50%; and
    based on the plurality of error signals, generate a plurality of correction signals to adjust a duty cycle and phase of an in-phase clock, wherein the in-phase clock is one of the input signals.

6. The circuit arrangement of claim 1, wherein the calibration circuit is configured to receive the calibration output data of the replica circuit during the foreground calibration mode to determine an initial replica correction code.

7. The circuit arrangement of claim 6, wherein the calibration circuit is configured to receive the calibration output data of the replica circuit during the background calibration mode to determine an updated replica correction code.

8. The circuit arrangement of claim 7, wherein the calibration circuit determines a difference in the initial replica correction code and the updated replica correction code.

9. The circuit arrangement of claim 8, wherein the calibration circuit generates corrected control signals, based upon an initial calibration correction code for the main circuit and the difference in the initial replica correction code and the updated replica correction code, to the main circuit and the replica circuit.

10. The circuit arrangement of claim 9, wherein the corrected control signals comprise corrected clock signals.

11. A method for calibrating a circuit in an integrated circuit device, the method comprising:
    configuring a main circuit to receive input data at a first input and generate output data at a first output, wherein the output data is based upon the input data and a function of the main circuit;
    configuring a replica circuit to receive calibration data at a second input and generate calibration output data, based upon the calibration data, at a second output, wherein the replica circuit provides a replica function of the function of the main circuit; and
    configuring a calibration circuit to receive the output data from the main circuit during a foreground calibration mode, and the calibration output data from the replica circuit during a background calibration mode, wherein the calibration circuit is coupled to the main circuit and to the replica circuit, wherein the calibration circuit is configured to provide control signals to the main circuit and the replica circuit during the background calibration mode.

12. The method of claim 11, further comprising configuring a selection circuit to receive the output data from the main circuit and the calibration output data from the replica circuit, wherein the selection circuit controls the selection of the output data and the calibration output data during the foreground calibration mode.

13. The method of claim 11, wherein the main circuit comprises a first serializer circuit configured to receive parallel input data and generate serial output data, wherein the first serializer circuit generates the serial output data during an operating mode.

14. The method of claim 13, wherein the replica circuit comprises a second serializer circuit configured to receive a parallel test pattern and generate the calibration output data during the operating mode.

15. The method of claim 14, further comprising configuring the calibration circuit to:
- generate a plurality of error signals based on a duty cycle of one or more differential pairs of input signals being equal to or greater than 50%; and
- based on the plurality of error signals, generate a plurality of correction signals to adjust a duty cycle and phase of an in-phase clock, wherein the in-phase clock is one of the input signals.

16. The method of claim 11, wherein the calibration circuit is configured to receive the calibration output data of the replica circuit during the foreground calibration mode to determine an initial replica correction code.

17. The method of claim 16, wherein the calibration circuit is configured to receive the calibration output data of the replica circuit during the background calibration mode to determine an updated replica correction code.

18. The method of claim 17, further comprising determining a difference in the initial replica correction code and the updated replica correction code.

19. The method of claim 18, further comprising generating corrected control signals, based upon the initial correction code for the main circuit and the difference in an initial replica correction code and the updated replica correction code, to the main circuit and the replica circuit.

20. The method of claim 19, wherein the corrected control signals comprise corrected clock signals.

* * * * *